US008045378B2

(12) United States Patent
Cernea

(10) Patent No.: US 8,045,378 B2
(45) Date of Patent: *Oct. 25, 2011

(54) NONVOLATILE MEMORY WITH CORRELATED MULTIPLE PASS PROGRAMMING

(75) Inventor: Raul-Adrian Cernea, Santa Clara, CA (US)

(73) Assignee: Sandisk Technologies Inc., Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 12/899,291

(22) Filed: Oct. 6, 2010

(65) Prior Publication Data

US 2011/0019471 A1    Jan. 27, 2011

Related U.S. Application Data

(63) Continuation of application No. 12/138,387, filed on Jun. 12, 2008, now Pat. No. 7,813,172.

(51) Int. Cl.
*G11C 16/04* (2006.01)

(52) U.S. Cl. ......... 365/185.03; 365/185.18; 365/185.19; 365/185.22

(58) Field of Classification Search .............. 365/185.03, 365/185.18, 185.19, 185.22, 185.05
See application file for complete search history.

(56) References Cited

U.S. PATENT DOCUMENTS

| 5,070,032 A | 12/1991 | Yuan et al. |
| 5,095,344 A | 3/1992 | Harari |
| 5,172,338 A | 12/1992 | Mehrotra et al. |
| 5,289,401 A | 2/1994 | Shima |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |

(Continued)

FOREIGN PATENT DOCUMENTS

EP        0 913 832 A1    5/1999

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Richard Elms
*Assistant Examiner* — Hien Nguyen
(74) *Attorney, Agent, or Firm* — Davis Wright Tremaine LLP

(57) ABSTRACT

A group of memory cells is programmed respectively to their target states in parallel using a multiple-pass programming method in which the programming voltages in the multiple passes are correlated. Each programming pass employs a programming voltage in the form of a staircase pulse train with a common step size, and each successive pass has the staircase pulse train offset from that of the previous pass by a predetermined offset level. The predetermined offset level is less than the common step size and may be less than or equal to the predetermined offset level of the previous pass. Thus, the same programming resolution can be achieved over multiple passes using fewer programming pulses than conventional method where each successive pass uses a programming staircase pulse train with a finer step size. The multiple pass programming serves to tighten the distribution of the programmed thresholds while reducing the overall number of programming pulses.

30 Claims, 27 Drawing Sheets

U.S. PATENT DOCUMENTS

| | | | |
|---|---|---|---|
| 5,701,266 | A | 12/1997 | Fazio et al. |
| 5,729,489 | A | 3/1998 | Fazio et al. |
| 5,768,192 | A | 6/1998 | Eitan |
| 5,774,397 | A | 6/1998 | Endoh et al. |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,366,496 | B1 | 4/2002 | Torelli et al. |
| 6,614,683 | B1 | 9/2003 | Parker |
| 6,714,448 | B2 | 3/2004 | Manea |
| 6,888,758 | B1 | 5/2005 | Hemink et al. |
| 7,042,766 | B1 | 5/2006 | Wang et al. |
| 7,095,654 | B2 | 8/2006 | Quader et al. |
| 7,151,692 | B2 | 12/2006 | Wu |
| 7,158,413 | B2 | 1/2007 | Kasai et al. |
| 7,251,160 | B2 | 7/2007 | Li et al. |
| 7,366,014 | B2 | 4/2008 | Micheloni et al. |
| 7,414,887 | B2 | 8/2008 | Guterman et al. |
| 7,426,138 | B1 | 9/2008 | Wong |
| 7,447,081 | B2 | 11/2008 | Cahn |
| 7,453,731 | B2 | 11/2008 | Tu et al. |
| 7,508,713 | B2 | 3/2009 | Sekar et al. |
| 7,508,715 | B2 | 3/2009 | Lee |
| 7,545,677 | B2 | 6/2009 | Lee et al. |
| 7,551,483 | B2 | 6/2009 | Cernea |
| 7,590,007 | B2 | 9/2009 | Futatsuyama |
| 7,606,084 | B2 | 10/2009 | Kamei |
| 7,643,348 | B2 | 1/2010 | Cernea |
| 7,796,435 | B2 * | 9/2010 | Cernea ............ 365/185.19 |
| 7,813,172 | B2 * | 10/2010 | Cernea ............ 365/185.03 |
| 2002/0191444 | A1 | 12/2002 | Gregori et al. |
| 2003/0002374 | A1 | 1/2003 | Tedrow |
| 2005/0219906 | A1 | 10/2005 | Wu |
| 2006/0140007 | A1 | 6/2006 | Cernea et al. |
| 2007/0030732 | A1 | 2/2007 | Micheloni et al. |
| 2007/0091681 | A1 | 4/2007 | Gongwer et al. |
| 2007/0159891 | A1 | 7/2007 | Tu et al. |
| 2007/0263450 | A1 | 11/2007 | Cernea et al. |
| 2008/0062765 | A1 | 3/2008 | Tu et al. |
| 2008/0137432 | A1 * | 6/2008 | Lee et al. ............ 365/185.19 |
| 2008/0253193 | A1 | 10/2008 | Cernea |
| 2008/0253197 | A1 | 10/2008 | Cernea |
| 2008/0310234 | A1 | 12/2008 | Lee et al. |
| 2009/0310418 | A1 | 12/2009 | Cernea |
| 2009/0310419 | A1 | 12/2009 | Cernea |
| 2009/0310420 | A1 | 12/2009 | Cernea |
| 2009/0310421 | A1 | 12/2009 | Cernea |
| 2010/0046297 | A1 | 2/2010 | Cernea |
| 2010/0097857 | A1 | 4/2010 | Cernea |

FOREIGN PATENT DOCUMENTS

| | | |
|---|---|---|
| EP | 1 074 995 A1 | 2/2001 |
| JP | 2001-057091 A | 2/2001 |
| TW | I256644 B | 6/2006 |
| TW | 200634826 A | 10/2006 |
| WO | WO 2008/002832 A2 | 1/2008 |
| WO | WO 2008/002832 A3 | 1/2008 |

OTHER PUBLICATIONS

EPO/ISA, "Notification of Transmittal of the International Search Report and the Written Opinion of the International Searching Authority, or the Declaration," corresponding International Patent Application No. PCT/US2009/046318, mailed on Jan. 29, 2010, 13 pages.

USPTO, "Office Action," mailed in related U.S. Appl. No. 12/138,382 on Jan. 26, 2010, 18 pages.

USPTO, "Notice of Allowance and Fee(s) Due," mailed in related U.S. Appl. No. 12/138,382 on May 19, 2010, 15 pages.

* cited by examiner

Programming into four states represented by a 2-bit code

Conventional Programming with alternating Progam/Verify sequence for a 4-state memory

| Bits/cell | # of States = Ns | Est. # of Program pulses = Np ~ Ns | Est. # of Program pulse train passes | # of states sensed in each verify =Vs | Est. # of Verify Cycles = Nv = k*Np*Vs |
|---|---|---|---|---|---|
| 1 | 2 | 2 | k | 1 | k*2 |
| 2 | 4 | 4 | k | 3 | k*12 |
| 3 | 8 | 8 | k | 7 | k*56 |
| 4 | 16 | 16 | k | 15 | k*240 |
| ... | ... | ... | ... | ... | ... |
| N | $2^N$ | $2^N$ | k | $2^N - 1$ | $\sim k*2^{2N}$ |

(k ~ 1 to 4)

Estimated number of program pulses and verify cycles to program a page using conventional alternating program/verify algorithm

FIG. 12

Predetermined Function for Predictive Programming

Designating the first programmed state as a checkpoint

Designating the threshold voltage level of a first programmed memory state as a checkpoint of the predetermined function for a memory cell — 724'

Example of a Distribution of a population of cells under Predictive programming

Latch Operation to built the Program Index for a memory cell

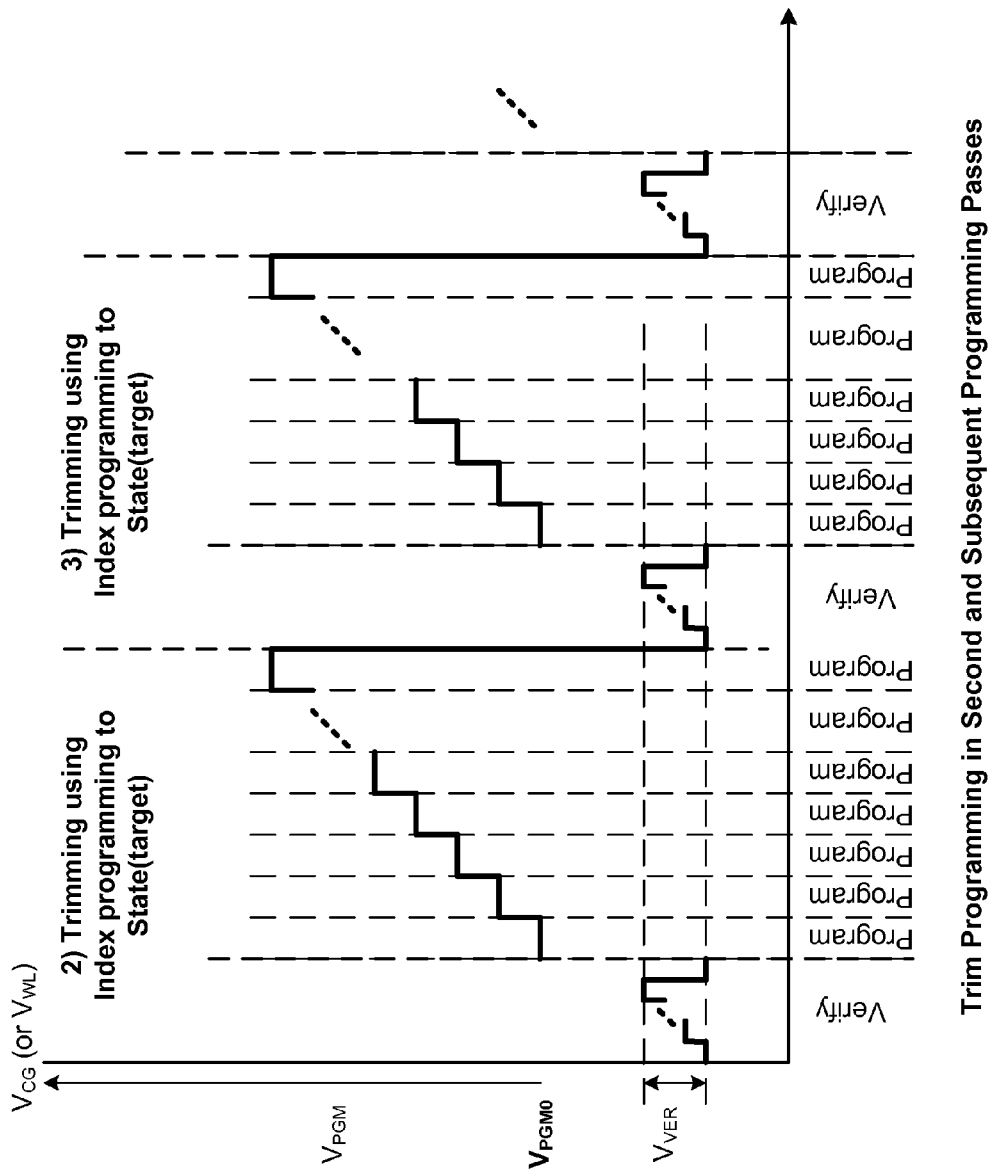

Verify Status Latch 432 —  0/1

FIG. 23

Set Verify Status Flag

| Setting a verify status flag in the latch according to the verified outcome | 842 |

| Responsive to the verify status flag indicating that the memory cell is not verified, proceeding to STEP 850 otherwise proceeding to STEP 870 of FIG. 21 | 844 |

FIG. 24A

Offset Program Index after cell not verified

| When the memory cell is not verified, incrementing the program index for the memory cell by a predetermined number so that in a subsequent programming pass, the memory cell is enabled to be subject to an additional predetermined number of pulses | 850' |

FIG. 24B

Offset Pulse # after cell not verified

| When the memory cell is not verified, decrementing the programming pulse count by a predetermined number so that in a subsequent programming pass, the memory cell is enabled to be subject to an additional predetermined number of pulses | 852 |

FIG. 24C

| N = Bits/cell | Ns = 2^N = # of States | 1.1) Checkpoint Program/Verify | | 1.2) Index Program & Verify | | 2) Additional k-1 Trim cycles of Index Program & Verify | | Est. Total Program pulses | Est. Total Verifies |
|---|---|---|---|---|---|---|---|---|---|
| | | Est. # of Program pulses | Est. # of Verifies | Est. # of Program pulses | Est. # of Verifies | Est. # of Program pulses | Est. # of Verifies | | |
| 1 | 2 | 1-2 | 1-2 | 2 | 2 | 2 | 2 | 6 | 6 |
| 2 | 4 | 1-4 | 1-4 | 4 | 4 | 4 | 4 | 10 | 10 |
| 3 | 8 | 1-8 | 1-8 | 8 | 8 | 8 | 8 | 18 | 18 |
| 4 | 16 | 1-16 | 1-16 | 16 | 16 | 16 | 16 | 34 | 34 |
| ... | ... | ... | ... | ... | ... | ... | ... | ... | ... |
| N | $2^N$ | $1-2^N$ | $1-2^N$ | $2^N$ | $2^N$ | $2^N$ | $2^N$ | $\sim k*2^N$ | $\sim k*2^N$ |

$(k \sim 2 \text{ to } 4)$

*FIG. 25*

Estimated number of program pulses and verify cycles to program a page using indexed program/verify algorithm Example of Distribution tightening by trimming using correlative programming passes

| N = Bits/cell | Ns = 2^N = # of States | 1st pass (coarse) | 2nd pass (½ as fine) | 3nd pass (1/4 as fine) | Total after three passes |
|---|---|---|---|---|---|
| | | # of Program pulses | # of Program pulses | # of Program pulses | # of Program pulses |
| 1 | 2 | 2 | 4 | 8 | 14 |
| 2 | 4 | 4 | 8 | 16 | 28 |
| 3 | 8 | 8 | 16 | 32 | 56 |
| 4 | 16 | 16 | 32 | 64 | 112 |
| ... | ... | ... | ... | ... | ... |
| N | $2^N$ | $2^N$ | $2^{N+1}$ | $2^{N+2}$ | $(2^0 + 2^1 + 2^2) \times 2^N$ |

Conventional Multiple-pass Programming

FIG. 28A

| N = Bits/cell | Ns = 2^N = # of States | 1st pass (coarse) | 2nd pass (offset ½ step) | 3rd pass (offset 1/4 step) | Total after three passes |
|---|---|---|---|---|---|
| | | # of Program pulses | # of Program pulses | # of Program pulses | # of Program pulses |
| 1 | 2 | 2 | 2 | 2 | 6 |
| 2 | 4 | 4 | 4 | 4 | 12 |
| 3 | 8 | 8 | 8 | 8 | 24 |
| 4 | 16 | 16 | 16 | 16 | 48 |
| ... | ... | ... | ... | ... | ... |
| N | $2^N$ | $2^N$ | $2^N$ | $2^N$ | $3 \times 2^N$ |

Correlated Multiple-pass Programming

FIG. 28B

Correlated Multiple-Pass Programming

NONVOLATILE MEMORY WITH CORRELATED MULTIPLE PASS PROGRAMMING

CROSS REFERENCE TO RELATED APPLICATIONS

This application is a continuation application of U.S. application Ser. No. 12/138,387, filed on Jun. 12, 2008, now U.S. Pat. No. 7,813,172. This application is also related to the following U.S. patent applications: U.S. application Ser. No. 12/138,371, entitled "METHOD FOR INDEX PROGRAMMING AND REDUCED VERIFY IN NONVOLATILE MEMORY" by Raul Adrian Cernea, filed on Jun. 12, 2008, now U.S. Pat. No. 7,800,945; U.S. application Ser. No. 12/138,378, entitled "NONVOLATILE MEMORY WITH INDEX PROGRAMMING AND REDUCED VERIFY" by Raul Adrian Cernea, filed on Jun. 12, 2008, U.S. Pat. No. 7,826,271. U.S. application Ser. No. 12/138,382, entitled "METHOD FOR CORRELATED MULTIPLE PASS PROGRAMMING IN NONVOLATILE MEMORY" by Raul Adrian Cernea, filed on Jun. 12, 2008, U.S. Pat. No. 7,796,435; U.S. patent application Ser. No. 11/733,694, "PREDICTIVE PROGRAMMING IN NON-VOLATILE MEMORY" filed on Apr. 10, 2007, by the same inventor as the present application, now U.S. Pat. No. 7,643,348; U.S. patent application Ser. No. 11/733,706, "NON-VOLATILE MEMORY WITH PREDICTIVE PROGRAMMING" filed on Apr. 10, 2007, by the same inventor as the present application, now U.S. Pat. No. 7,551,483; and co-pending U.S. patent application Ser. No. 12/649,184 filed on Dec. 29, 2009, by the same inventor as the present application, U.S. Patent Publication No. 2010/0097857 A1.

FIELD OF THE INVENTION

This invention relates generally to non-volatile semiconductor memory such as electrically erasable programmable read-only memory (EEPROM) and flash EEPROM, and specifically to memory and programming operations in which the number of program-verify operations is minimized.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify cycle may incur up to 16 sensing operations. Thus, with increasing number of distinguishable state levels in multi-level memory cells ("MLC"), the verify cycle of the program/verify scheme becomes increasingly time-consuming.

U.S. patent application Ser. No. 11/531,227, entitled, "Method for Non-volatile Memory with Linear Estimation of Initial Programming Voltage" filed by Loc Tu et al on Sep. 12, 2006, now U.S. Pat. No. 7,453,731, discloses a method of estimating initial programming voltages by linear estimation. In order to achieve good programming performance for a non-volatile memory, the initial programming voltage $V_{PGM0}$ and the step size must be optimally chosen at the factory. This is accomplished by testing each page of memory cells. The word line coupled to a selected page is successively programmed by a series of voltage pulses of a staircase waveform with verifications in between the pulses until the page is verified to a designated pattern. The programming voltage at the time the page is programmed verified will be used to estimate by linearly scaling back to the initial value of a starting programming voltage for the page. The estimation is further refined by using the estimate from a first pass in a second pass. Thus, conventional alternating programming and verifications are used to establish a final programming voltage for successfully programming a page. Then the final programming voltage is linearly scaled back to arrived at an estimated initial programming voltage for the page. This type of scaling is on a gross scale at a page level and does not address the disadvantage of conventional programming and verifying the memory in the field on a cell by cell basis.

In particular, the conventional programming requires a verify operation in between every pulse. When the memory is partitioned into many memory states, the verify operation must check many states in between every pulse. The number of verify operations increases with the square of the number of state partitions. Thus, for memory that hold 3 or more bits of data per cell, the number of verify operations become prohibitively large.

To improve programming resolution, a conventional method is to make the programming pulse step size finer. However, this has the effect of proportionally increasing the number of pulses require to program thereby increasing programming time. Furthermore, the increase in programming pulses will compound to the number of interleaving verifications in conventional methods.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

Correlated Multi-Pass Programming

In a multi-state memory, each cell can be programmed to one of the multi-states with a threshold voltage within one of predefined ranges of threshold voltages. In a population of such memory cells, it is desirable to program accurately so that the various ranges of threshold voltages or distributions do not spread out to form indistinct ranges. One technique of tightening the distribution is to perform multiple programming passes, each time using a finer programming pulse step size. However, with ever finer pulse step size, the programming performance decreases with the increase in the number of pulses.

According to another aspect of the invention, a group of memory cells are programmed in parallel in multiple programming passes in which the programming voltages in the multiple passes are correlated. Each programming pass employing a programming voltage in the form of a staircase pulse train with a common step size, and each successive pass has the staircase pulse train offset from that of the previous pass by a predetermined offset level. The predetermined offset level is less than the common step size and may be less than or equal to the predetermined offset level of the previous pass.

In one preferred embodiment, the predetermined offset is half of that of the previous pass. For example, the staircase pulse train of the second pass is offset from the first by half a step size and the staircase pulse train of the third pass is offset from the second by a quarter step size. In each pass the number of pulses is the same. In this way, the same programming resolution can be achieved over multiple passes using fewer programming pulses than that the conventional method of using multiple passes with each pass using a programming staircase pulse train with finer step size.

The correlation multi-pass programming is advantageous in improving the programming performance by reducing the number of programming pulses over multiple programming passes.

The multiple-pass index programming technique allows substantial saving in the number of verify operations. Similarly, the multiple-pass correlated programming technique allows substantial saving in the number of programming pulses required. The two techniques can be integrated together into a high performance, multiple-pass index and correlated programming. The benefits are even more so for a memory configured to store three or more bits of data per cell.

Additional features and advantages of the present invention will be understood from the following description of its preferred embodiments, which description should be taken in conjunction with the accompanying drawings.

BRIEF DESCRIPTION OF THE DRAWINGS

FIG. 12 is a table illustrating estimated numbers of programming pulses and verifying cycles to program a page using conventional alternating program/verify algorithm.

FIG. 22 illustrates the additional verifying and programming passes shown in STEP 820 of FIG. 21 for trimming the programmed results after the first pass.

FIG. 23 illustrates schematically a latch for storing a verify status flag.

FIG. 24A is a flow diagram illustrating a method of enabling unverified memory cells for further programming by the use of the verify status flag.

FIG. 24B is a flow diagram illustrating a method of enabling unverified memory cells for further programming by offsetting the program index for the memory cell.

FIG. 24C is a flow diagram illustrating a method of enabling unverified memory cells for further programming by offsetting the pulse count.

FIG. 25 is a table illustrating estimated numbers of programming pulses and verifying cycles to program a page using the index programming technique.

FIG. 28A is a table showing the number of programming pulses used in a conventional multiple-pass programming for various partitioning of memory states.

FIG. 28B is a table showing the number of programming pulses used in the correlated multiple-pass programming for various partitioning of memory states.

DETAILED DESCRIPTION OF THE PREFERRED EMBODIMENTS

Memory System

FIG. 1 to FIG. 10 illustrate example memory systems in which the various aspects of the present invention may be implemented.

Figure 11:
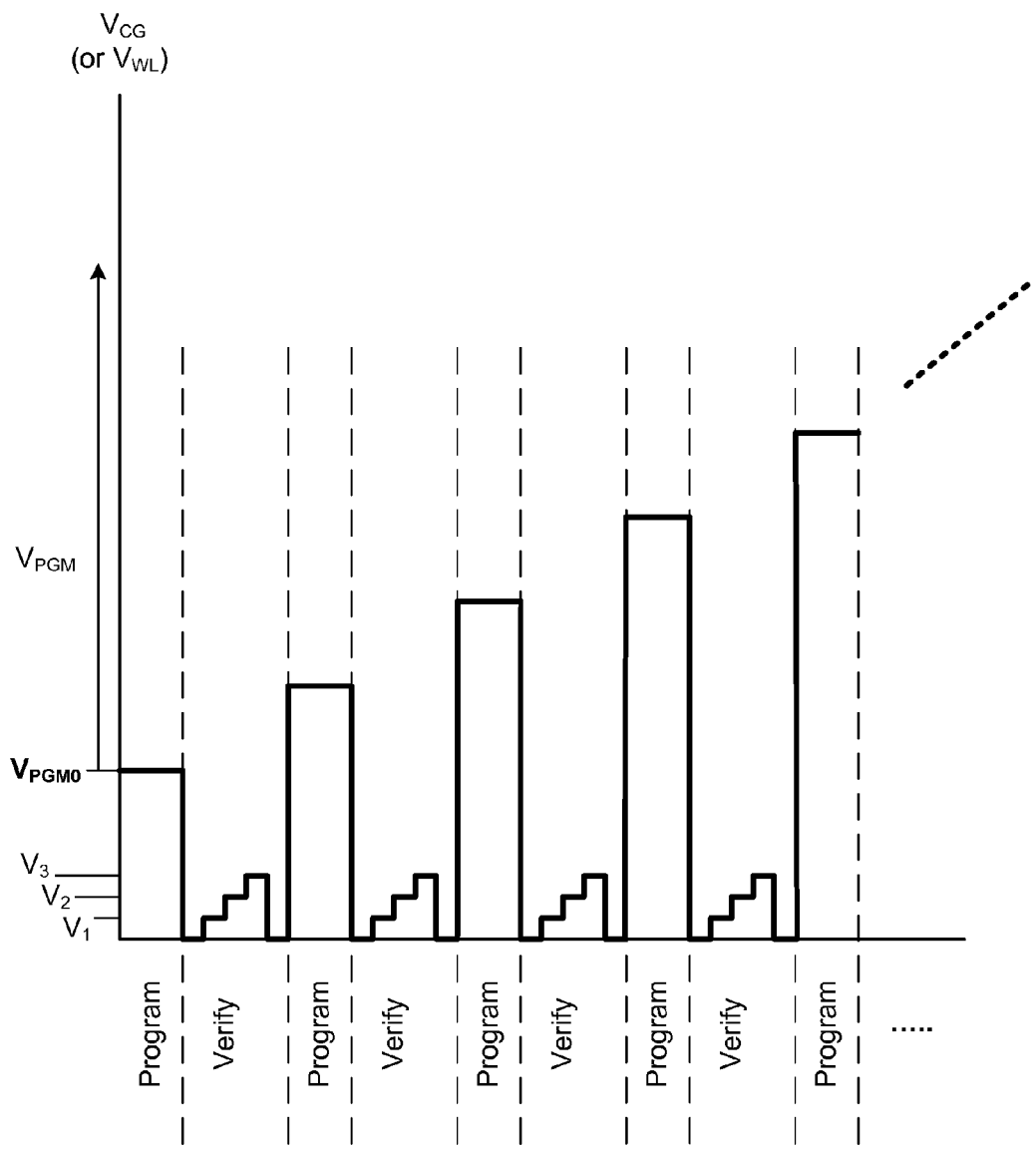
FIG. 11 illustrates a conventional technique for programming a 4-state memory cell to a target memory state.

FIG. 11 and FIG. 12 illustrate a conventional programming technique.

FIG. 13 to FIG. 29 illustrate the various aspects and embodiments of the present invention.

Figure 1:
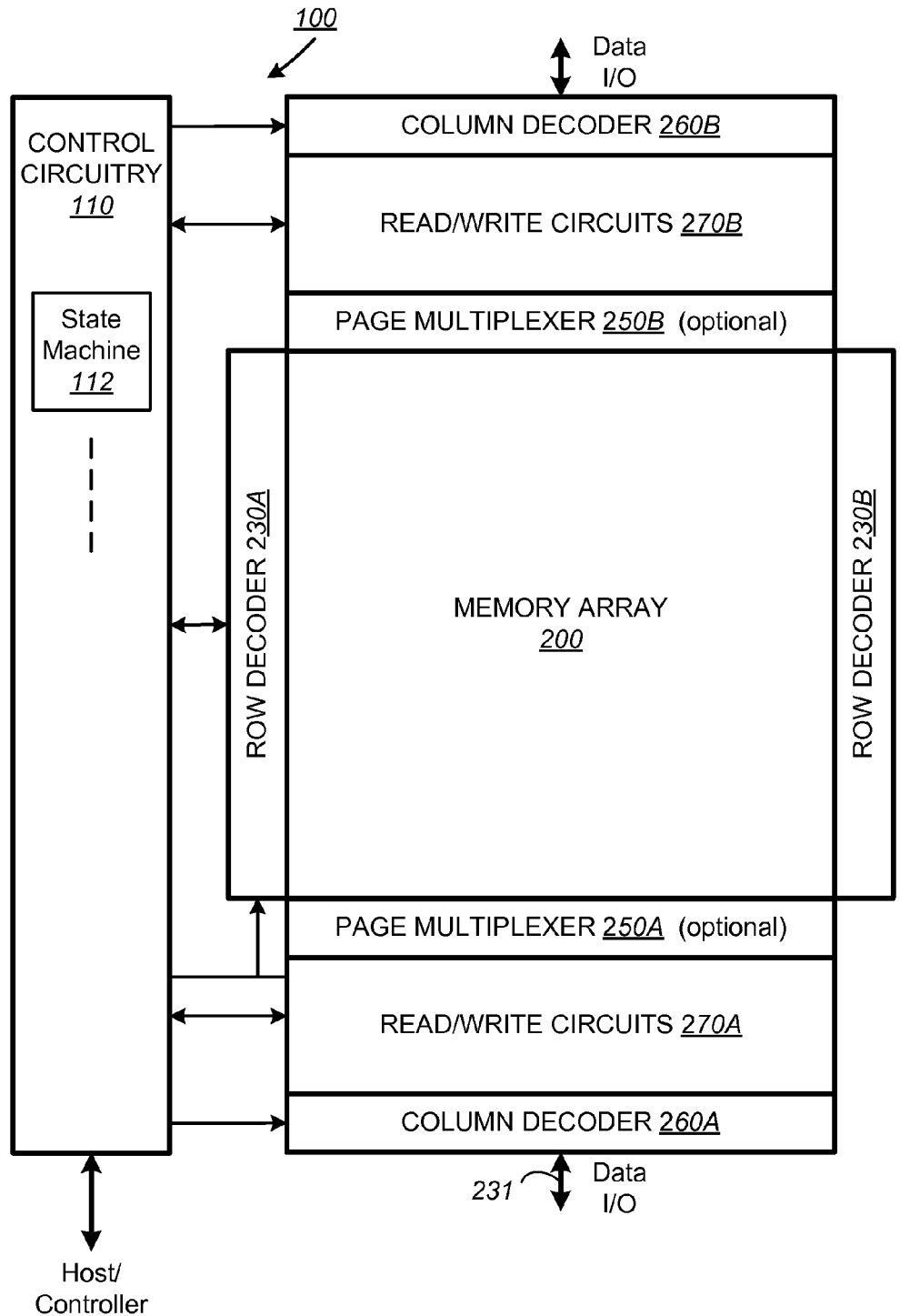
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
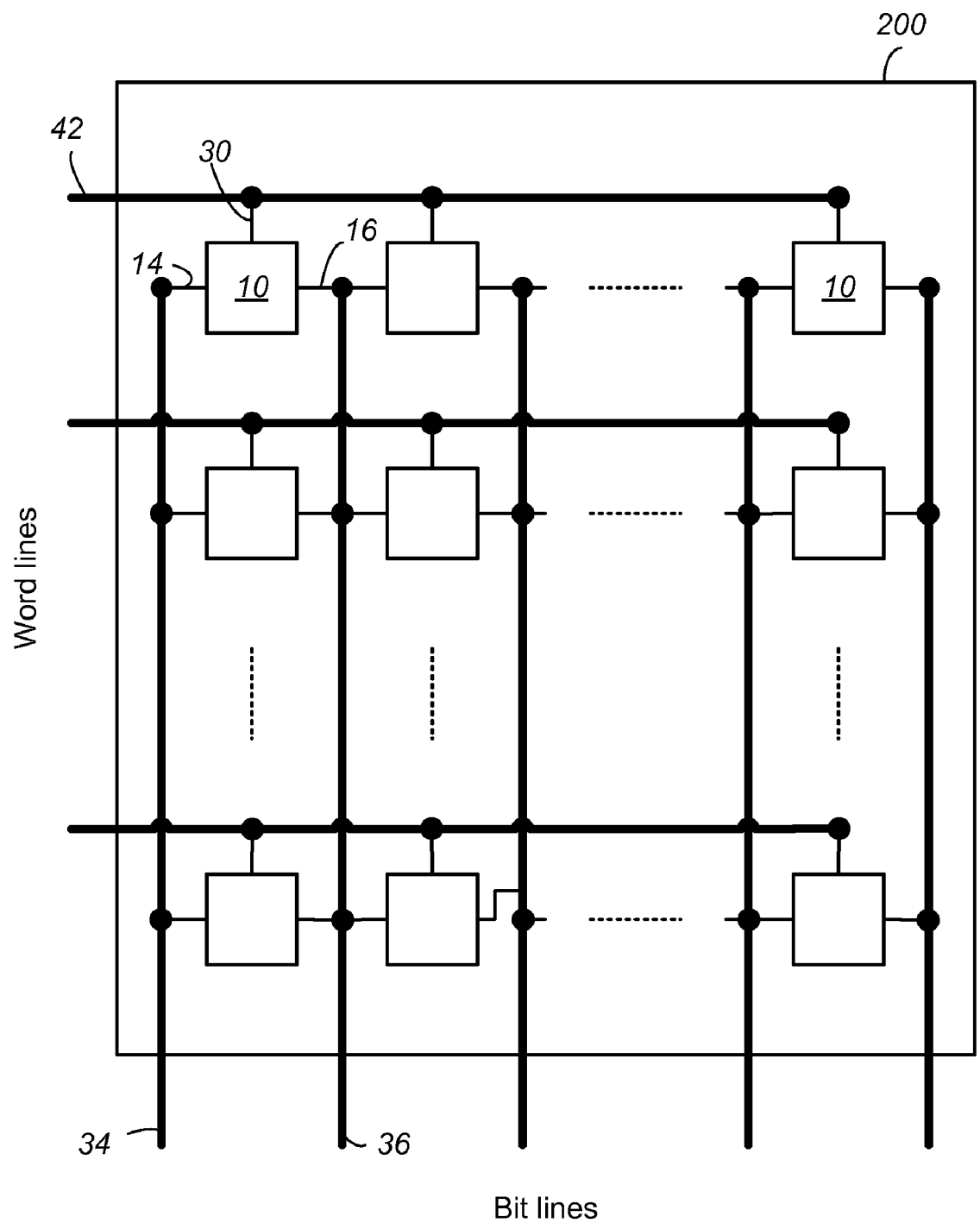
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
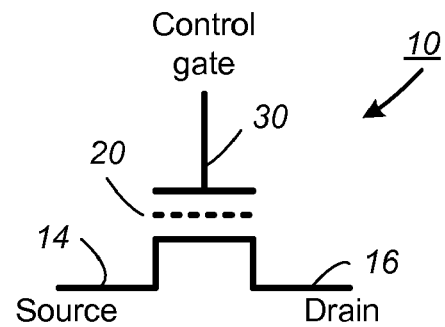
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
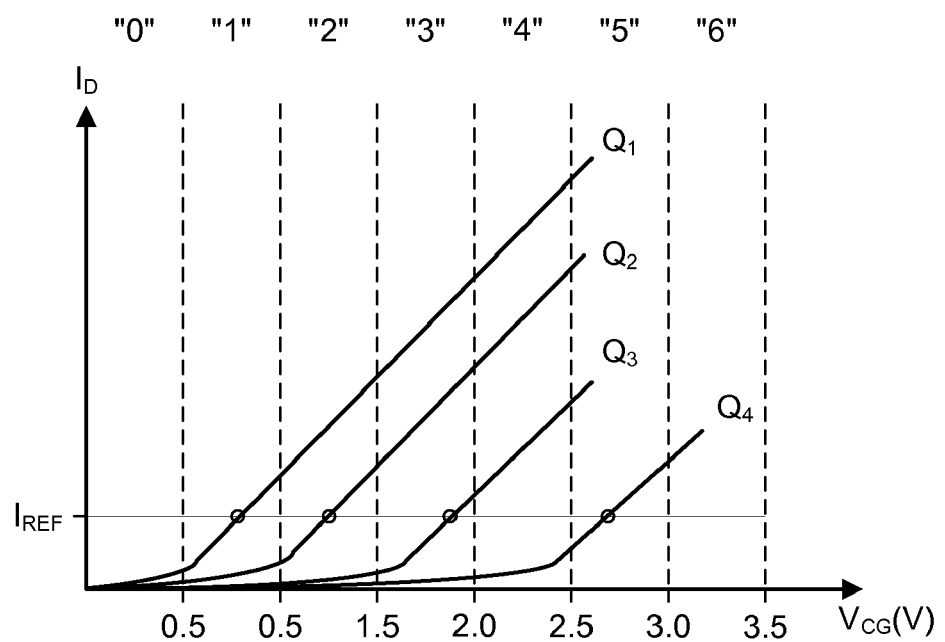
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
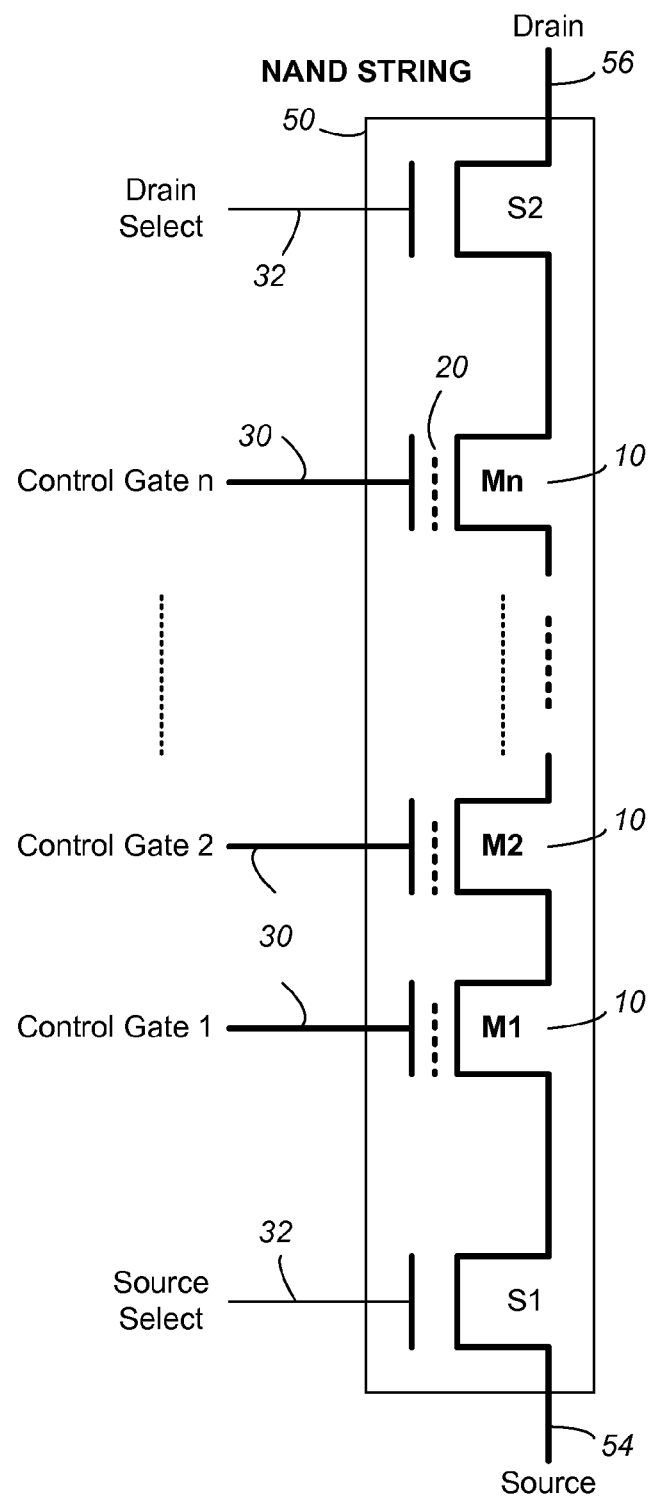
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor Si is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
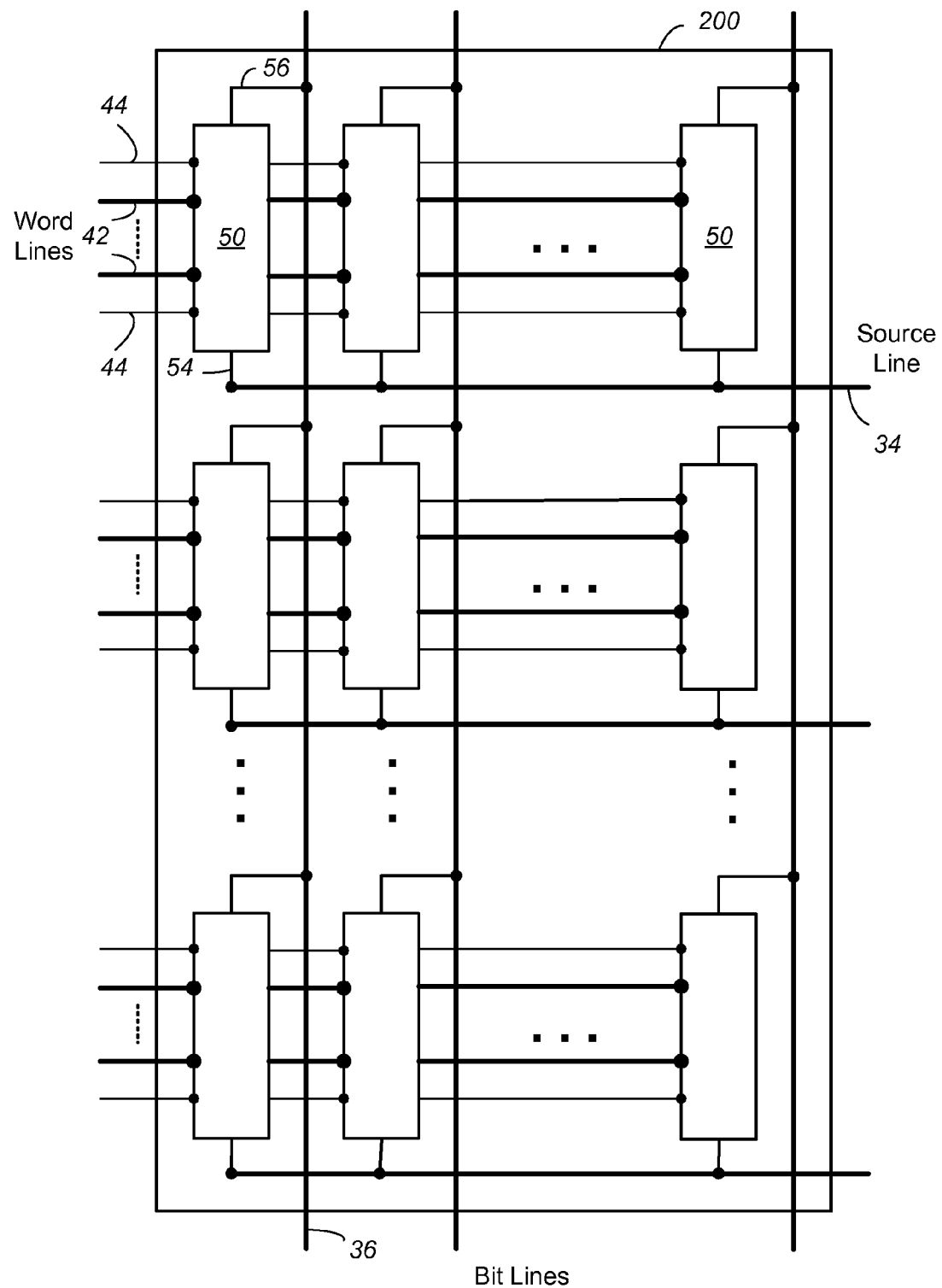
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
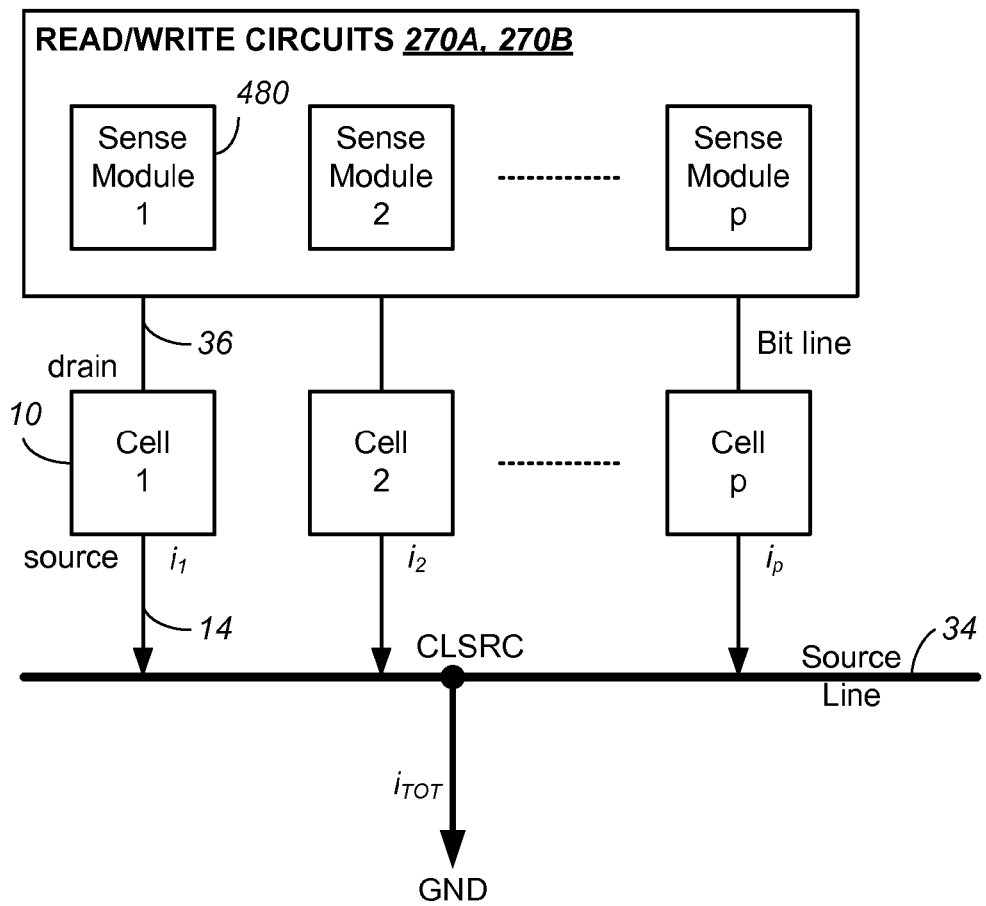
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
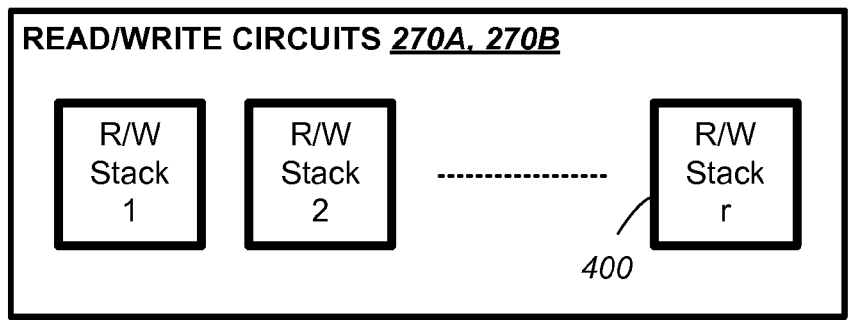
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
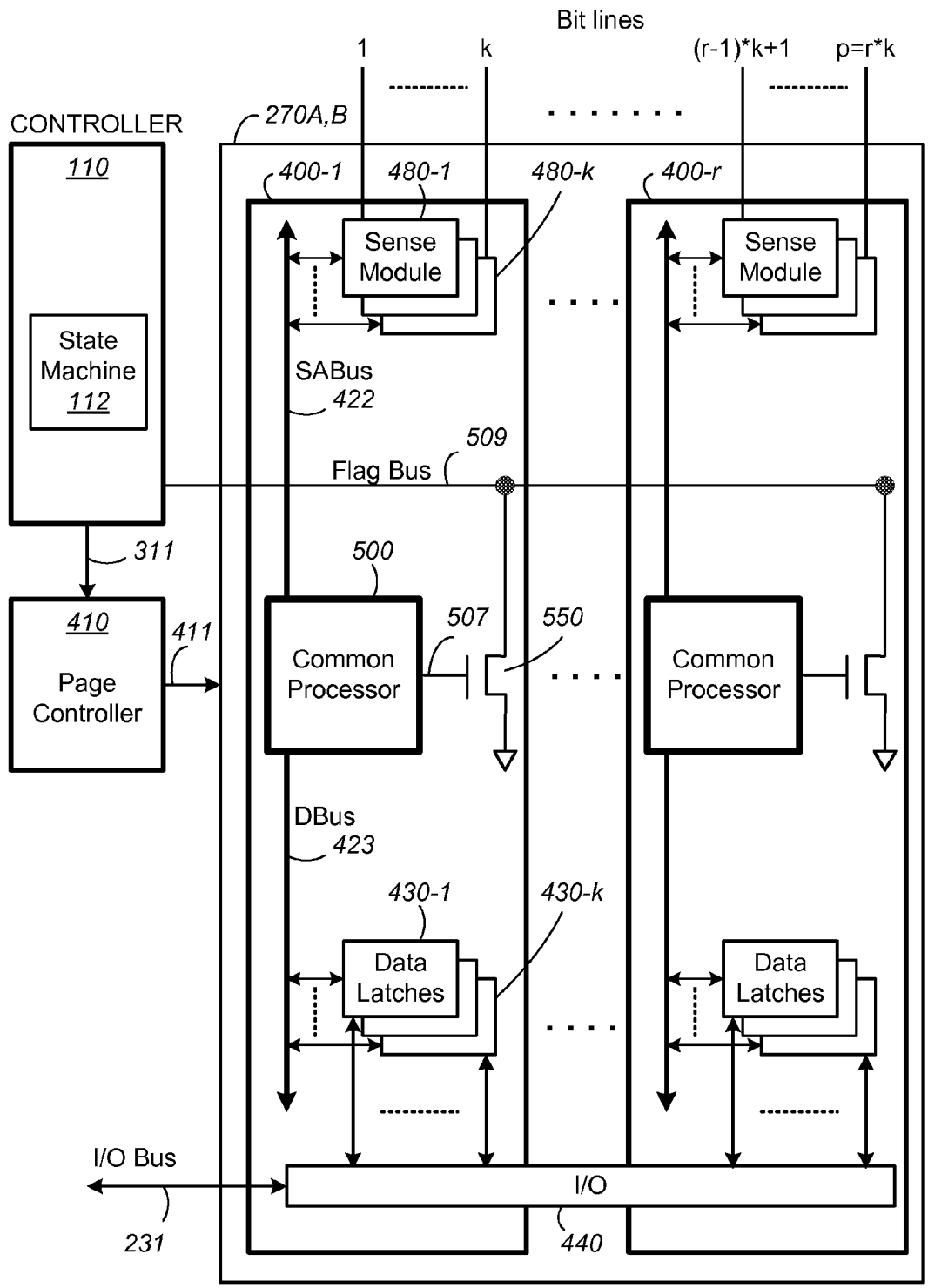
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-state Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
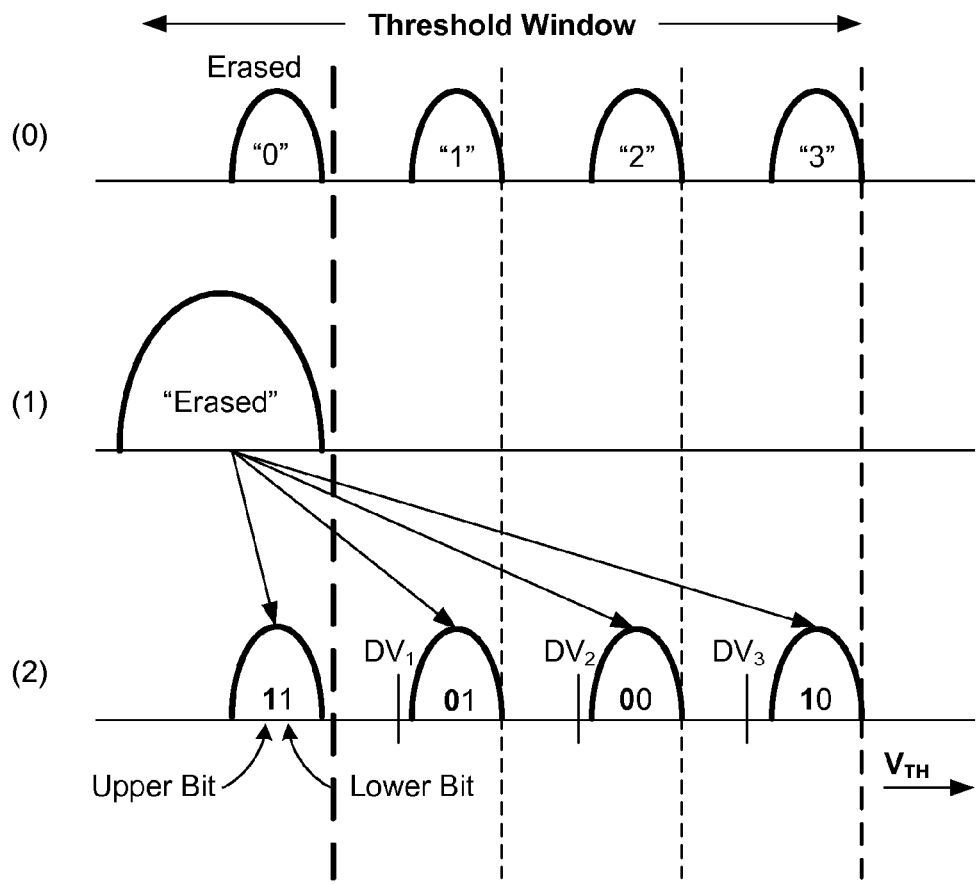
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $DV_1$, $DV_2$ and $DV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $DV_1$, $DV_2$ and $DV_3$ in three sub-passes respectively.

Figure 10:
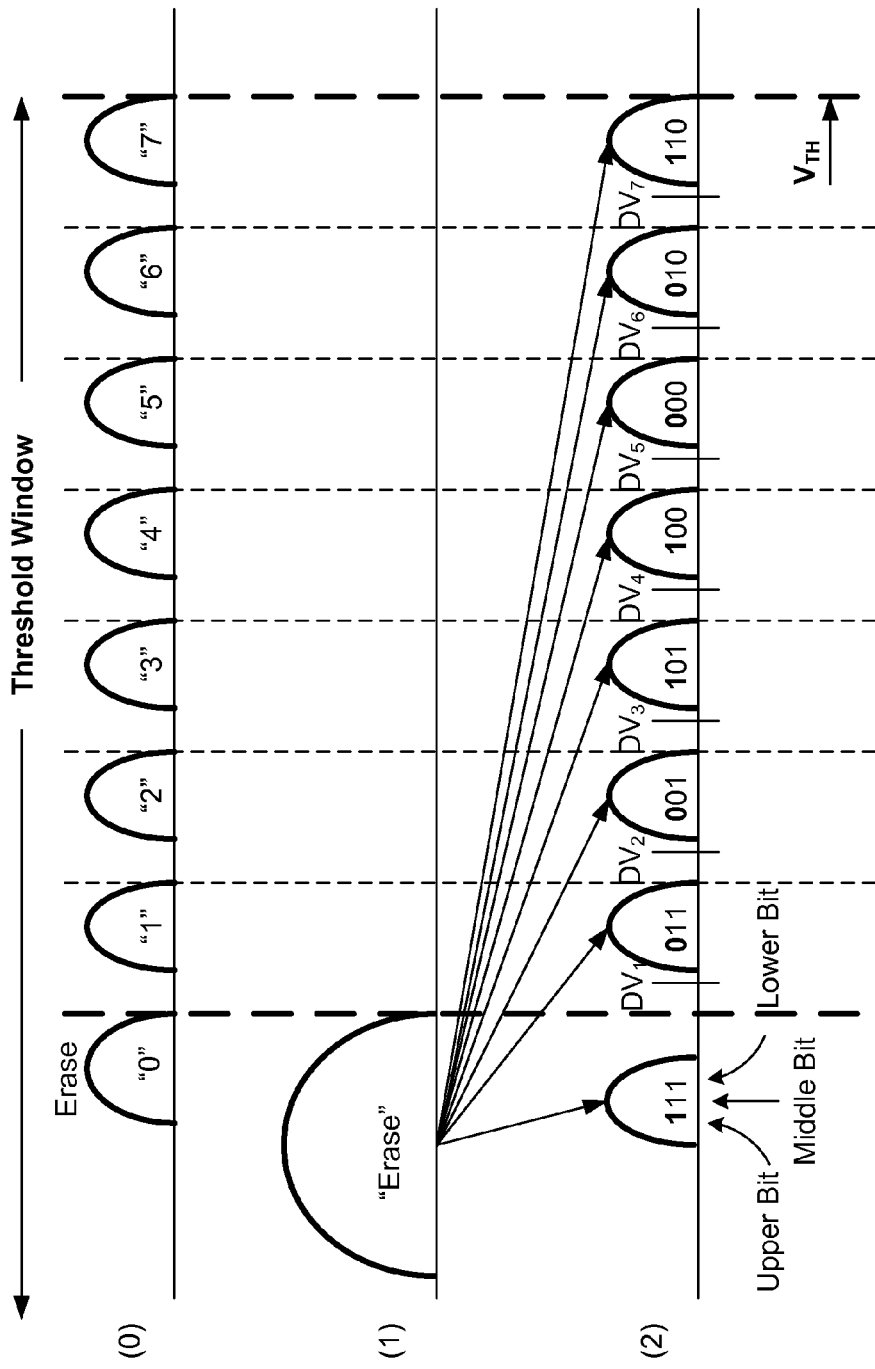
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $DV_1$-$DV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $DV_1$-$DV_7$ in seven sub-passes respectively.

Page or Word-line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with the partitioning of a memory into increasing number of states, the verify cycle of the program/verify scheme becomes increasingly time-consuming.

FIG. 12 is a table illustrating estimated numbers of programming pulses and verifying cycles to program a page using conventional alternating program/verify algorithm. For example, for an N-bit memory, the partitioning is into $Ns=2^N$ states. The number of program pulses is at least the same of the number of states Ns. Some algorithm may require k programming passes, where k may be 1 to 4.) For multi-state memory, each verify operation is further multiplied by $2^N-1$, one for each programmed state. Thus, the estimated number of verified is proportional to $2^{2N}$, which is the square of the number of states. As can be seen from the table, for a 3-bit cell, the nominal number of verify cycles is already extremely high, and that is not including additional sensing required in other schemes. For 4-bit cell, the number of verify cycle is prohibitive.

Thus, there is a need for a memory device with improved programming performance where the number of verify cycles is reduced.

Index Programming Techniques

According to one general aspect of the invention, a multiple-pass index programming method operating on a group of memory cells in parallel comprises maintaining for each cell a program index in order to provide information such as the last programming voltage level the cell has received so that in a subsequent programming pass, programming or inhibiting programming of the cell relative to the program index can be made.

Preferably, on each programming pass, a programming voltage as in a series of incrementing pulses in the form of a staircase pulse train is applied to the group of memory cells so that with increasing pulse count, the memory cells are exposed to increasing programming voltages. In the preferred embodiment, each discrete programming voltage level is expediently expressed as a pulse count or pulse number. Similarly, the program index is expressed in terms of a pulse number.

In a programming pass of the group of memory cells, the program index of a cell in the group is used to control whether to allow or inhibit programming relative to each of the incrementing pulses.

Figure 13:
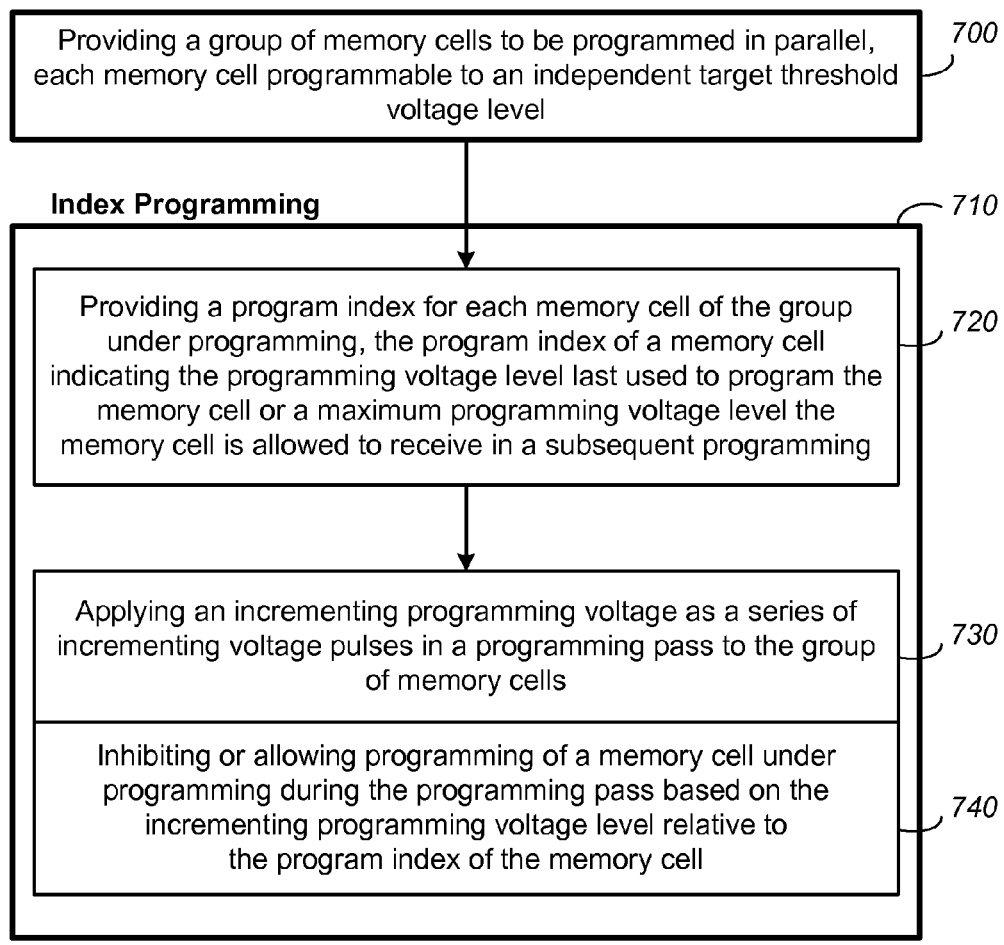
FIG. 13 is a flow diagram illustrating a general scheme of the index programming method.

FIG. 13 is a flow diagram illustrating a general scheme of the index programming method.

STEP 700: Providing a group of memory cells to be programmed in parallel, each memory cell programmable to an independent target threshold voltage level.

STEP 710 is index programming which further comprises STEP 720, STEP 730, and STEP 732

STEP 720: Providing a program index for each memory cell of the group under programming, the program index of a memory cell indicating the programming voltage level last used to program the memory cell or a maximum programming voltage level the memory cell is allowed to receive in a subsequent programming. The program index is preferably implemented by additional latch circuits co-operating with the read/write circuits.

STEP 730: Applying an incrementing programming voltage as a series of incrementing voltage pulses in a programming pass to the group of memory cells.

STEP 740: Inhibiting or allowing programming of a memory cell under programming during the programming pass based on the incrementing programming voltage level relative to the program index of the memory cell It will be seen that as the programming voltage increases, each memory cell of the group being programming in parallel is prevented from over-programming after the programming voltage has reached the level indicated by the program index of the cell. In this way, unlike conventional programming method, it is not necessary to have a verify step in between each and every programming pulses.

In a first implementation, the program index of a cell is obtained from an initial programming experience of the memory cell. The program index stores the last programming voltage level or the pulse number applied to the cell before it is program-inhibited during a programming pass. The program index for each cell is established by interleaving programming and verifying steps as in a conventional interleaving program/verify method. The programming for a cell in the group is inhibited after the cell has been program-verified and the last pulse number is recorded as its program index. While this implementation may incur more verifying steps, it is less likely to over program any cell. The program index established for each cell can then be used advantageously in subsequent programming passes to save verity steps.

In a first implementation of providing the program index for a memory cell, the memory cell is programmed by a series of programming pulses, each pulse followed by a verify until the memory cell is program-verified to the target threshold voltage level. The program index for the memory cell is set to be commensurate with the final programming voltage when the memory cell is program-verified.

Figure 14A:
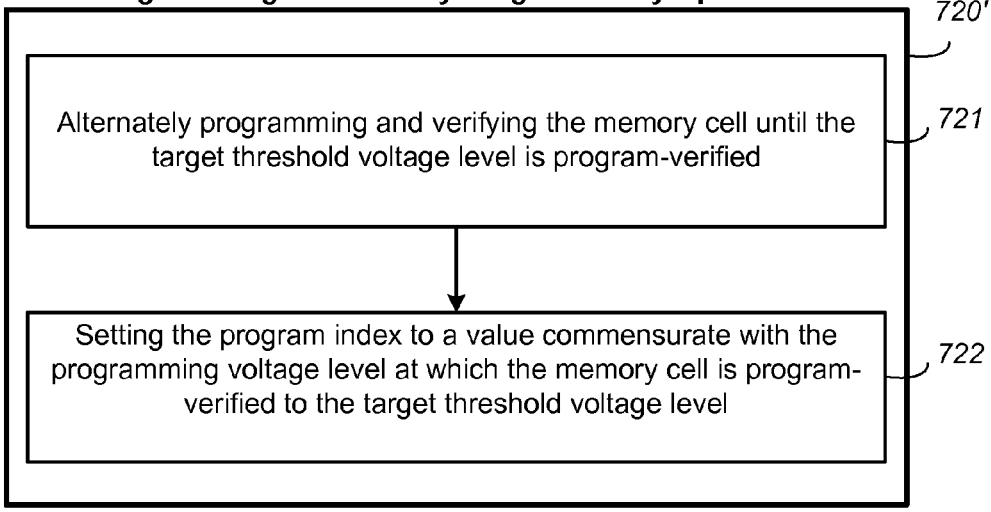
FIG. 14A is a flow diagram illustrating providing the program index of a memory cell according to the first implementation.

FIG. 14A is a flow diagram illustrating providing the program index of a memory cell according to the first implementation. Thus STEP 720' corresponding to STEP 720 shown in FIG. 13 further comprises STEP 721 and STEP 722:

STEP 721: Alternately programming and verifying the memory cell until the target threshold voltage level is program-verified.

STEP 722: Setting the program index to a value commensurate with the programming voltage level at which the memory cell is program-verified to the target threshold voltage level.

It will be seen that the first implementation is to obtain the program index by a conventional programming technique where the memory cell is verified after each programming pulse. This method provides the most accurate program of a cell close to its target, but at the expense of many more verify operations.

In a second implementation, the program index of a cell is initially set to an estimated maximum programming voltage level for the cell to program close to but not exceed its target state, such as within a predetermined shortfall from the target state. As the staircase pulse train is applied to each cell in the group, a cell is inhibited from further programming after reaching the expected maximum programming voltage level as indicated by its program index. Subsequent pulses of the staircase pulse train will have no effect on the inhibited cell. At the end of the programming pass, the each cell in the group will be programmed close to each respective target state and each program index will reflect the last programming voltage level each cell has received.

Figure 14B:
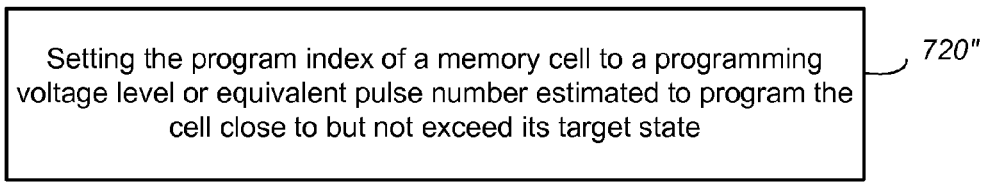
FIG. 14B is a flow diagram illustrating a second implementation of obtaining the program index for a memory cell.

FIG. 14B is a flow diagram illustrating a second implementation of obtaining the program index for a memory cell. Thus STEP 720" corresponding to STEP 720 shown in FIG. 13 comprises:

STEP 720": Setting the program index of a memory cell to a programming voltage level or equivalent pulse number estimated to program the cell close to but not exceed its target state.

In a third implementation, the program index of a cell is estimated from an initial programming experience of the memory cell. In particular, the memory cell is programmed by a series of programming pulses, each pulse followed by a verify, from an erased state to a given threshold voltage level which serves as a checkpoint and which calibrates a predictive function from which the program index or the programming voltage level for a given target threshold voltage level is obtained.

Figure 14C:
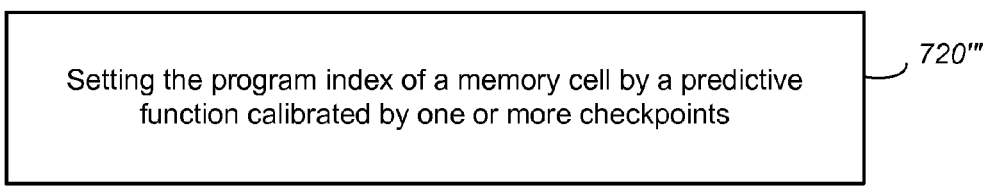
FIG. 14C is a flow diagram illustrating a third implementation of obtaining the program index of a memory cell using a predictive function calibrated by one or more checkpoint.

FIG. 14C is a flow diagram illustrating a third implementation of obtaining the program index of a memory cell using a predictive function calibrated by one or more checkpoint. Thus STEP 720''' corresponding to STEP 720 shown in FIG. 13 comprises:

STEP 720''': Setting the program index of a memory cell by a predictive function calibrated by one or more checkpoints.

The third implementation of obtaining the program index of cell by a predictive technique is described in more detail in connection with FIG. 14D to FIG. 21.

Figure 14D:
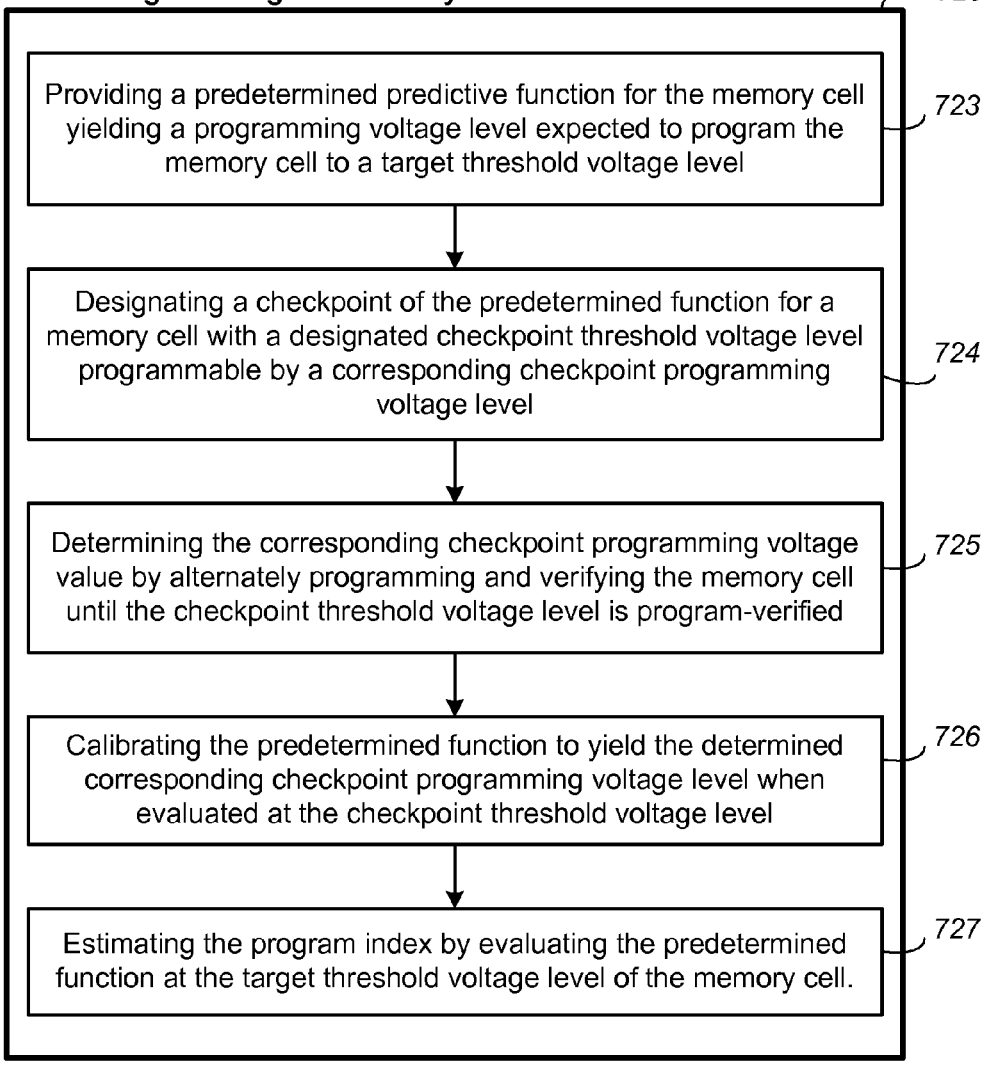
FIG. 14D is a flow diagram illustrating a third implementation of obtaining the program index of a memory cell according to one embodiment.

FIG. 14D is a flow diagram illustrating a third implementation of obtaining the program index of a memory cell according to one embodiment. Thus STEP 720''' corresponding to STEP 720 shown in FIG. 13 further comprises STEP 723 to STEP 727.

STEP 723: Providing a predetermined predictive function for the memory cell yielding a programming voltage level expected to program the memory cell to a target threshold voltage level.

STEP 724: Designating a checkpoint of the predetermined function for a memory cell with a designated checkpoint threshold voltage level programmable by a corresponding checkpoint programming voltage level STEP 725: Determining the corresponding checkpoint programming voltage value by alternately programming and verifying the memory cell until the checkpoint threshold voltage level is program-verified.

STEP 726: Calibrating the predetermined function to yield the determined corresponding checkpoint programming voltage level when evaluated at the checkpoint threshold voltage level.

STEP 727: Estimating the program index by evaluating the predetermined function at the target threshold voltage level of the memory cell.

In a second embodiment of providing a program index for a memory cell, multiple checkpoints are employed to improve the accuracy of the program index.

Figure 14E:
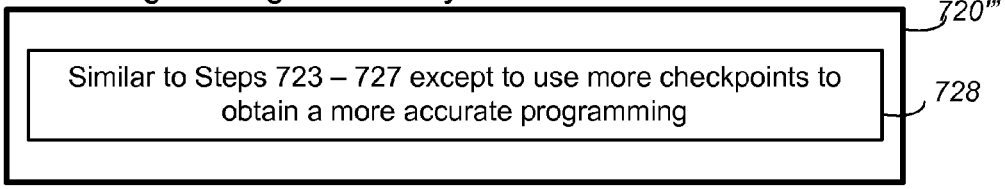
FIG. 14E is a flow diagram illustrating a third implementation of obtaining the program index of a memory cell according to another embodiment.

FIG. 14E is a flow diagram illustrating a third implementation of obtaining the program index of a memory cell according to another embodiment.

Thus STEP 720'''' corresponding to STEP 720 shown in FIG. 13 further comprises STEP 728.

STEP 728: Similar to STEPs 723-727 of FIG. 14D except to use more checkpoints to obtain a more accurate programming.

Predictive Programming from a Checkpoint

Figures 15, 16:
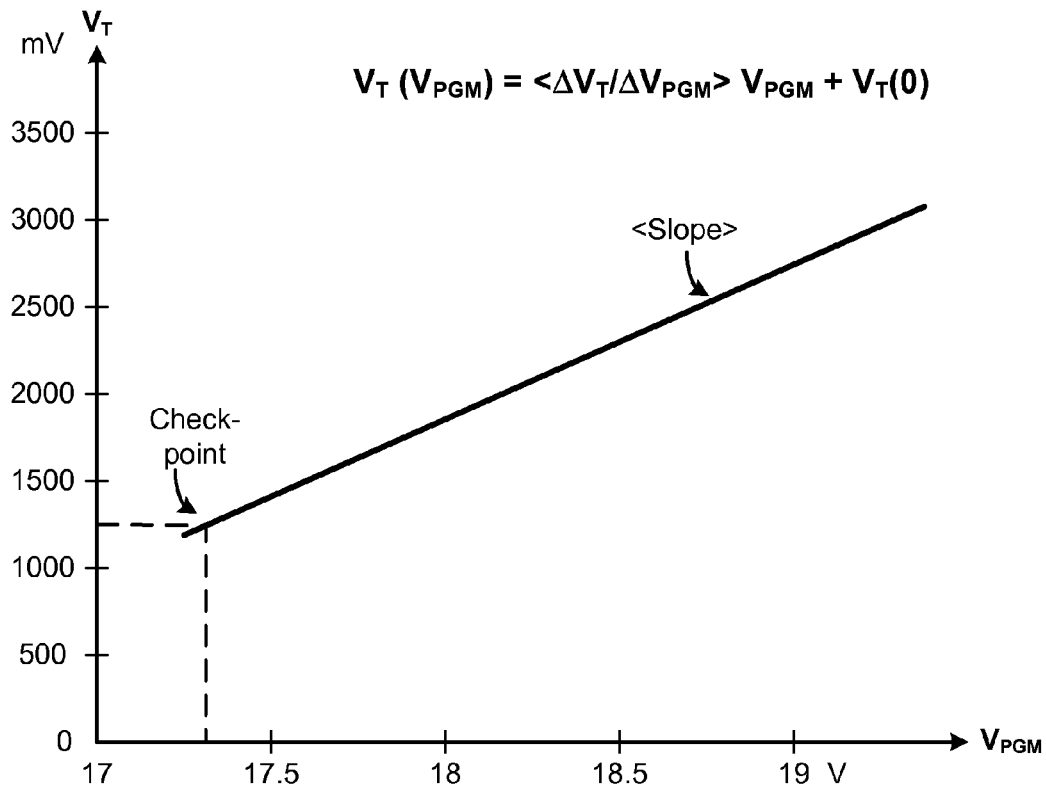
FIG. 15 illustrates a preferred embodiment of the predetermined function used to provide the programming voltage needed to program the memory cell to a targeted threshold voltage level.
FIG. 16 illustrates a preferred designation for the checkpoint to correspond to a first programmed state above the erased state.
Figure 17:
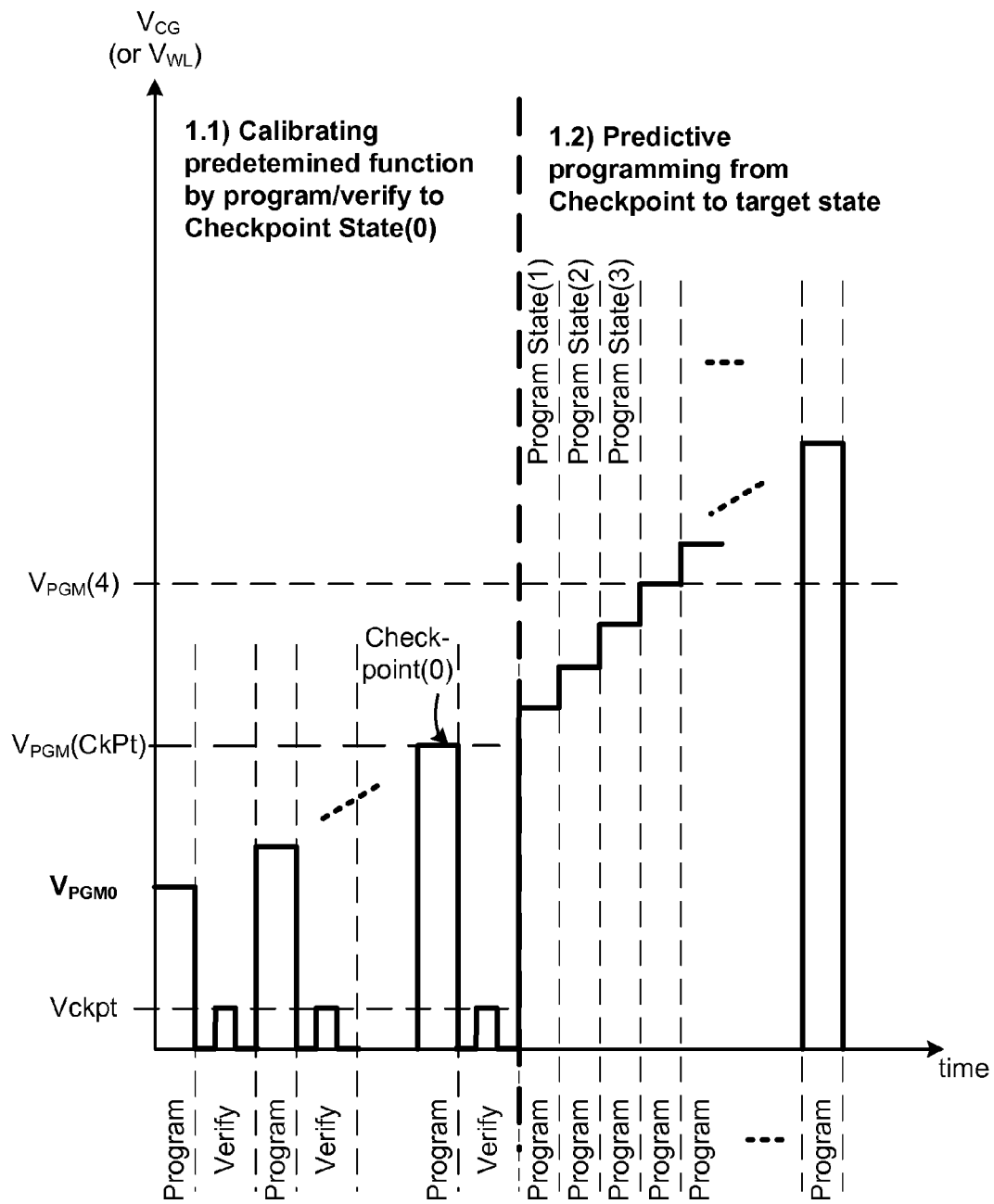
FIG. 17 illustrates the predictive programming employed in a first programming pass and to build the program index for each cell.

FIG. 15, FIG. 16, and FIG. 17 describe in more detail the predictive programming shown in STEP 720''' of FIG. 14A.

In a nonvolatile memory having an array of memory cells, wherein the memory cells are individually programmable to one of a range of threshold voltage levels, there is provided a predetermined function that predicts what programming voltage level needs to be applied in order to program a given memory cell to a given target threshold voltage level. In this way, no verify operation needs be performed, thereby greatly improving in the performance of the programming operation.

In one embodiment, the predetermined function is approximated by a linear function, which proportionally yields a programming voltage level for a given targeted threshold voltage level. The linear function has a slope given by a predetermined average value applicable to the population of cells of the memory array. The linear function is uniquely determined for the given memory cell by predetermining a checkpoint on the linear function for the given memory cell. The checkpoint is based on an actual programming voltage that programs the memory cell to a designated threshold voltage level. The checkpoint preferably corresponds to one of lowest program states of the memory cell. The memory cell is initially programmed to the checkpoint by employing, for example, the conventional program/verify programming technique. In this way, the checkpoint values of the actual programming voltage necessary to program the memory cell to the designated memory state is determined. The predetermined function is thus calibrated to yield the checkpoint programming voltage value when evaluated at the checkpoint threshold voltage level before being used to determine a programming voltage value for programming the memory cell to the target threshold voltage level.

The predictive programming technique is advantageous in that programming to a target state does not require verify operations. A verify operation only needs to verify the checkpoint state rather than all the possible states of the memory.

FIG. 15 illustrates a preferred embodiment of the predetermined function used to provide the programming voltage needed to program the memory cell to a targeted threshold voltage level. The predetermined function is approximated by a linear function where the targeted threshold level $V_T$ is given as a function of the programming voltage $V_{PGM}$ by the relation:

$$V_T(V_{PGM}) = \text{<Slope>} V_{PGM} + V_T(0) \qquad \text{Equation (1)}$$

(where $\text{<Slope>} = \Delta V_T / \Delta V_{PGM}$)

Conversely, $$V_{PGM}(V_T) = 1/\text{<Slope>} [V_T - V_T(0)]; \qquad \text{Equation (2)}$$

In the preferred embodiment, the mean <Slope> can be predetermined by testing at the factory samples from similar production batches. For example, the testing may yield <Slope> to be 0.9 on average with a standard deviation of about 0.1. The $V_T(0)$ is cell-dependent and is predetermined by a checkpoint from each memory cell prior to a predictive programming of each cell. Once the <slope> and $V_T(0)$ are known, the predetermined function for the memory cell is defined and Equation (2) can be used to obtain the programming voltage level needed to program to a targeted threshold voltage level.

In general the predetermined function need not be approximated by a linear function. If the predetermined function is to accurately cover a wide range of threshold voltage levels, it can be determined by testing the production batch at the factory and modeled by some suitable function.

Checkpoint Calibration of the Predictive Function for Each Memory Cell

The $V_T(0)$ in Equation (1) or (2) is cell-dependent and is predetermined by designating a checkpoint threshold voltage slightly above that of the erased state and actually alternately programming and verifying in between pulses a given cell to the checkpoint. In this way, the actual programming voltage needed to program the given cell to the checkpoint threshold voltage is known. This actual coordinate is then used to solve for $V_T(0)$ in Equation (2).

FIG. 14A, STEP 722, STEP 723 and STEP 724 illustrate a general principle of calibrating the predetermined function for a memory cell using a checkpoint of the function.

FIG. 16 illustrates a preferred designation for the checkpoint to correspond to a first programmed state above the erased state. As will be seen in the description in the next section, when the programming pulse train has a step size that enable each pulse to program a cell to a next memory state, the checkpoint will serve as a calibrated base state. Obviously, if the program data for a cell requires the cell to remain in the erased state, no checkpoint will be necessary.

STEP 724': Designating the threshold voltage level of a first programmed memory state as a checkpoint of the predetermined function for a memory cell.

Thus, the checkpoint(0) for the memory cell is designated to be at a threshold voltage level (checkpoint threshold voltage level) slightly higher than that considered to be associated with the erased state. In the first phase of the first programming pass, a series of increasing programming voltage pulses is applied to program the memory cell toward the checkpoint threshold voltage level. The programming mode can be the conventional one of alternately programming and verifying until the checkpoint threshold voltage level is program-verified. Once the set of coordinates $[V_{PGM}, V_T]_{Checkpoint(0)}$ for Checkpoint(0) is known, the predetermined function (see FIG. 15) in the form of Equation (2) can be solved for $V_T(0)$ and be completely specified.

After the predetermined function in the form of Equation (2) is specified, the memory cell can subsequently be programmed in the second phase in the predictive mode using the predetermined function to provide an estimated programming voltage level for a targeted threshold voltage level or for a targeted memory state.

Predictive programming calibrated by one or more checkpoint is also disclosed in co-pending U.S. patent application Ser. No. 11/733,694, "PREDICTIVE PROGRAMMING IN NON-VOLATILE MEMORY" filed on 10 Apr. 2007 by the same inventor as the present application, now U.S. Pat. No. 7,643,348, and in co-pending U.S. patent application Ser. No. 11/733,706, "NON-VOLATILE MEMORY WITH PREDICTIVE PROGRAMMING" filed on 10 Apr. 2007 by the same inventor as the present application, now U.S. patent application Ser. No. 7,551,483. The entire disclosures of the two above-mentioned applications are incorporated herein by reference.

FIG. 17 illustrates the predictive programming employed in a first programming pass and to build the program index for each cell. The first programming pass is in two phases. In the example shown, the first phase programs the memory cells and maintains a program index using the predictive programming method of the third implementation (see FIG. 14C.) The predictive programming employs a predetermined function for each cell which provides an estimated programming voltage needed to program a given cell to a given target state.

The first phase of the first programming pass is to calibrate the predetermined function for each cell according to the programming characteristic of each cell. This is accomplished by alternately programming/verifying each cell to a designated threshold voltage or checkpoint. The checkpoint is preferably at a threshold voltage adjacent that of the erased state so the alternately programming and verifying typically involve relatively few pulses. Each verify step in between pulses need only sense one demarcation value for the checkpoint.

In phase two, each cell will continue to be programmed starting from the checkpoint, which is at a known position from the next memory state. Hence the predetermined function will be able to predict the programming voltage expected to program the cell to a given target state without having to verify in between pulses as in the conventional trail and error method. The program index for each cell will be the last programming voltage level or pulse number used to program the cell in the first programming pass.

Programming Voltage as a Pulse Train with Predetermined Step Size

In a preferred embodiment, the programming voltage step size is adjusted such that each additional pulse will program the memory cell to the next memory state. For example of a memory cell with 16 possible memory states, the pulse size may be 300 mV. In this way, one additional pulse will program the memory to State(1), another additional pulse will program the memory to State(2), etc. Thus, programming to a given memory state can be reduced to counting the number of states from State(0) and supplying the same number of pulses. For example, a flag may be set once in State(0) and thereafter the memory cell can be programmed by a number of pulses same as the number of states the target state is away from State(0).

Other programming pulse sizes are possible. For example, for the memory cell with 16 possible memory states, the pulse size may be 150 mV. In that case, it will take two pulses to program from one memory state to the next adjacent memory state. This will provide finer resolution in the programming, which is useful in some implementations where a margin from the targeted threshold is employed.

Figure 18A:
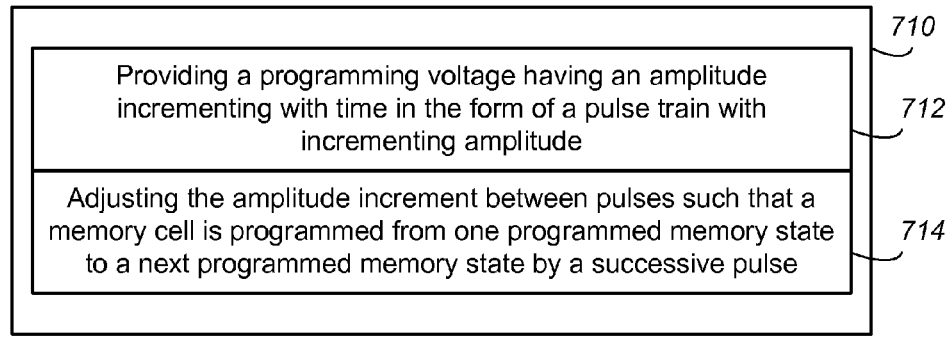
FIG. 18A is a flow diagram illustrating setting a programming voltage with step size such that each additional pulse will program a memory cell to the next memory state.

FIG. 18A is a flow diagram illustrating setting a programming voltage with step size such that each additional pulse will program a memory cell to the next memory state. The STEP 710 shown in FIG. 13 further includes:

STEP 712: Providing a programming voltage having an amplitude incrementing with time in the form of a pulse train with incrementing amplitude.

STEP 714: Adjusting the amplitude increment between pulses such that a memory cell is programmed from one programmed memory state to a next programmed memory state by a successive pulse.

Figure 18B:
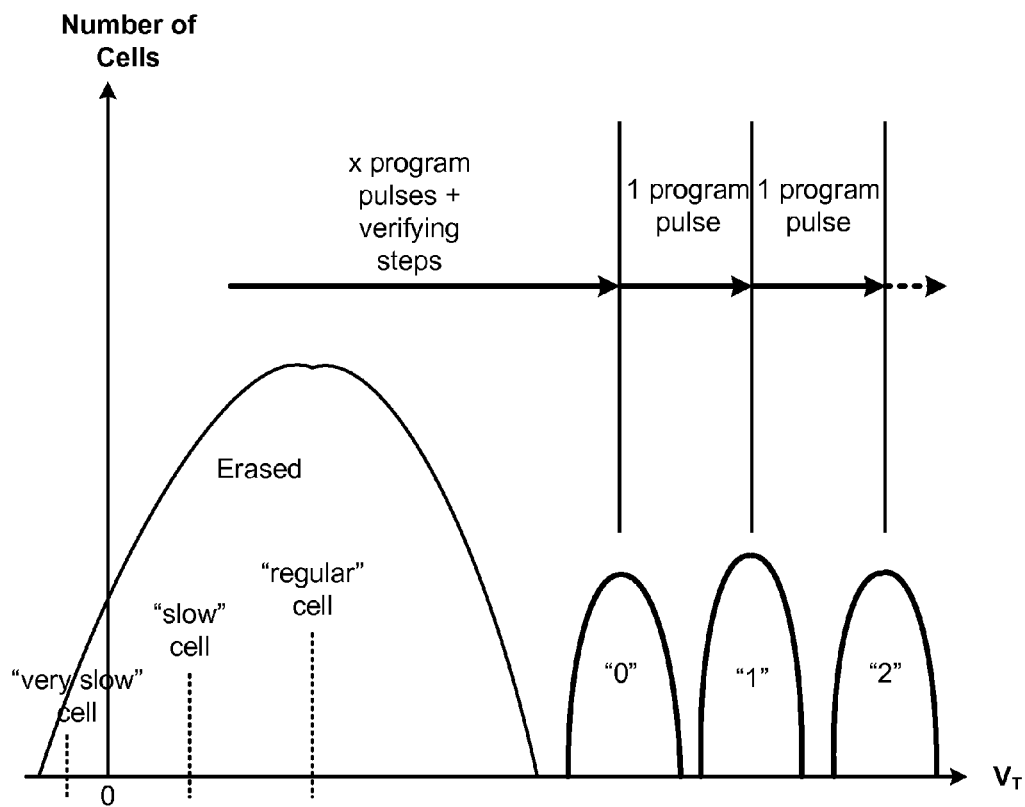
FIG. 18B illustrates schematically the threshold voltage of a memory cell undergoing the first programming pass.

FIG. 18B illustrates schematically the threshold voltage of a memory cell undergoing the first programming pass. The memory cell starts off in an erased state which may in any one of low-lying threshold voltage levels. During the initial programming phase, a series of program/verify cycles (e.g., a total of x program pulses plus n*x verifying steps) will program the memory cell from the erase state to State(0). In general, the x for each memory cell is independent of each other. Due to how deeply erased the individual cells were and other factors, the individual cells may differ by the number of programming pulses to arrive at a designated checkpoint. For example, a "slow" cell which has a threshold voltage lower will take more pulses to get to State(0) than a "regular" cell with a higher threshold voltage. A "very slow" cell which is deeply erased will have a threshold voltage even lower and will take make programming pulses to bring it to State(0). Once, the memory cell is in State(0), predictive programming mode commences and each additional pulse will program the memory cell to the next memory state.

Figure 19:
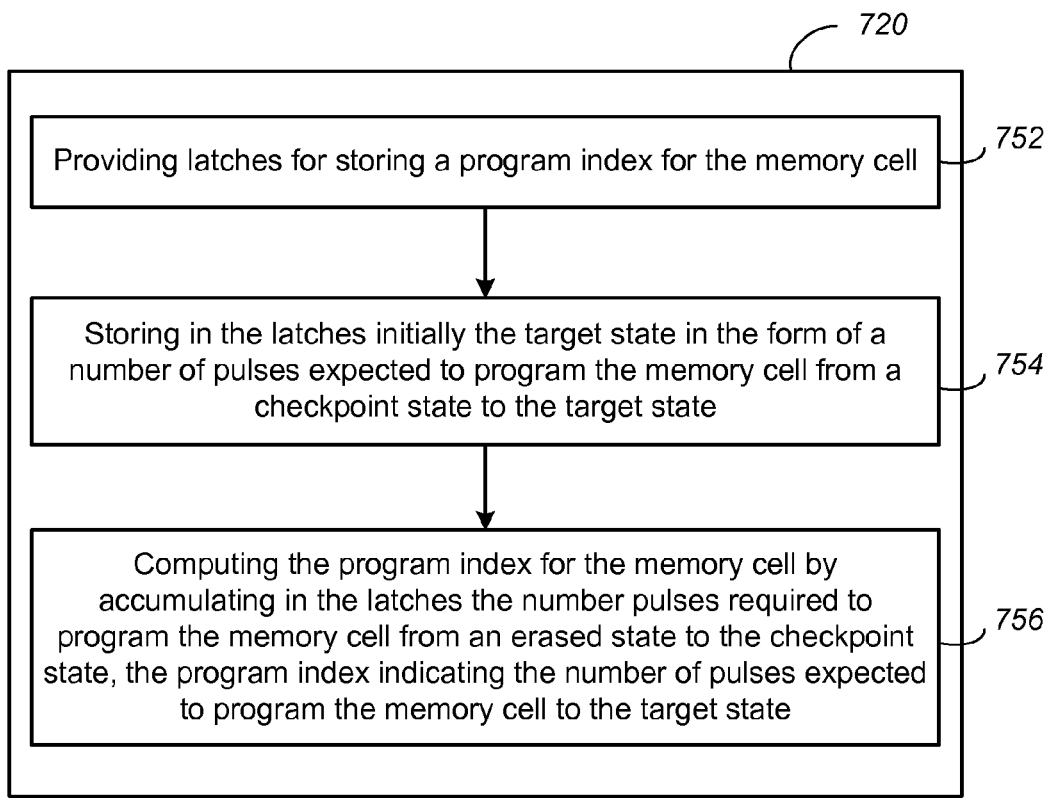
FIG. 19 is a flow diagram illustrating a preferred implementation of establishing a program index for a memory cell.
Figure 20:
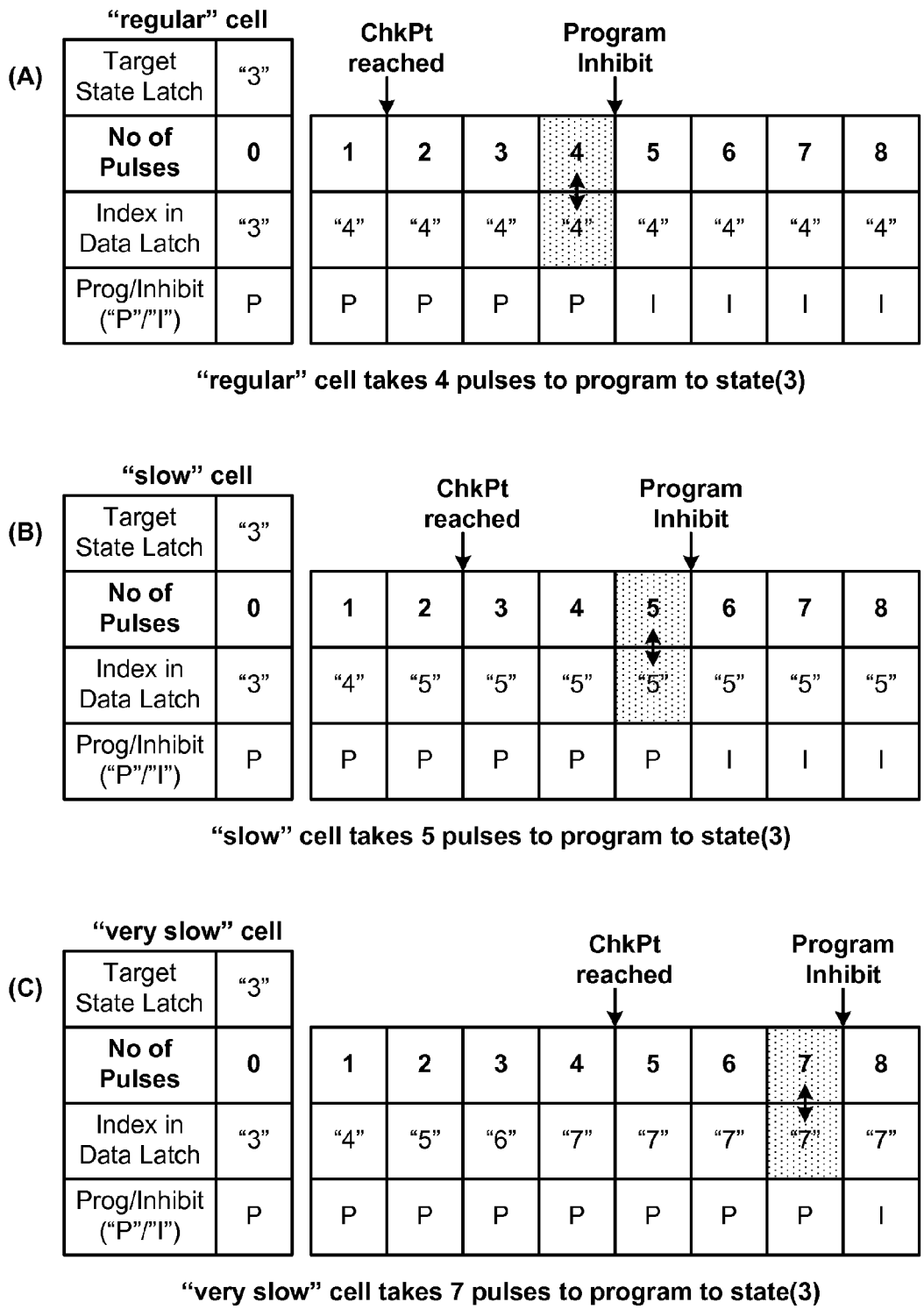
FIGS. 20(A), 20(B) and 20(C) respectively illustrate the latch operation of FIG. 19 for a "regular" cell, a "slow" cell and a "very slow" cell shown in FIG. 18B.

FIG. 19 is a flow diagram illustrating a preferred implementation of establishing a program index for a memory cell. The program index is maintained in one of the data latches 430 associated with the memory cell as shown in FIG. 8. The STEP 720 shown in FIG. 13 further includes:

STEP 752: Providing latches for storing a program index for the memory cell.

STEP 754: Storing in the latches initially the target state in the form of a number of pulses expected to program the memory cell from a checkpoint state to the target state. For example, if the target state is State(5), then the value "5" will be stored in the latches (binary value 0101).

STEP 756: Computing the program index for the memory cell by accumulating in the latches the number pulses required to program the memory cell from an erased state to the checkpoint state, the program index indicating the number of pulses expected to program the memory cell to the target state. For example, each time a pulse is applied to the memory cell in programming it from the erased state to the checkpoint, the program index in the latch is incremented by one.

FIGS. 20(A), 20(B) and 20(C) respectively illustrate the latch operation of FIG. 19 for a "regular" cell, a "slow" cell and a "very slow" cell shown in FIG. 18B.

FIG. 20(A) illustrates the latch operation for computing a program index for the example "regular" memory cell shown in FIG. 18B. The "regular" memory cell has been erased to a threshold voltage that lies near the middle of the range of the threshold voltages of the erased population. The memory cell is to be programmed to State(3) as indicated by the data in a target state latch. Accordingly, the data latches for maintain the program index are initially set to "3". With every programming pulse to get the memory cell from the erased state to the checkpoint state(0), the value in the data latches is incremented by one. Increment stops when the checkpoint is program-verified. In this example, this happens after one pulse and the program index in the latches has incremented to "4". This means that this cell expects four pulses to program to State(3). To program the cell from the checkpoint to State (3), additional three pulses to bring the total to four pulses are applied. After the cell has been subject to the number of pulses equal to the program index, the cell is inhibited from programming while other cells in the page may continue to be programmed. This is indicated by a Program/Inhibit status going from "P" to "I".

FIG. 20(B) illustrates the latch operation for computing a program index for the example "slow" memory cell shown in FIG. 18B. The "slow" memory cell has been erased to a threshold voltage that lies lower than the middle of the range of the threshold voltages of the erased population. The memory cell is also to be programmed to State(3) as indicated by the data in a target state latches. Accordingly, the data latches for maintain the program index are initially set to "3". With every programming pulse to get the memory cell from the erased state to the checkpoint state(0), the value in the data latch is incremented by one. Increment stops when the checkpoint is program-verified. In this example, this happens after two pulses and the program index in the latch has incremented to "5". This means that this cell expects five pulses to program to State(3). To program the cell from the checkpoint to State (3), additional three pulses to bring the total to five pulses are applied. After the cell has been subject to the number of pulses equal to the program index, the cell is inhibited from programming while other cells in the page may continue to be programmed. This is indicated by a Program/Inhibit status going from "P" to "I".

FIG. 20(C) illustrates the latch operation for computing a program index for the example "very slow" memory cell shown in FIG. 18B. The "very slow" memory cell has been erased to a threshold voltage that lies in the lower tail end of the range of the threshold voltages of the erased population. The memory cell is also to be programmed to State(3) as indicated by the data in a target state latches. Accordingly, the data latch for maintain the program index is initially set to "3". With every programming pulse to get the memory cell from the erased state to the checkpoint state(0), the value in the data latches is incremented by one. Increment stops when the checkpoint is program-verified. In this example, this happens after four pulses and the program index in the latches has incremented to "7". This means that this cell expects seven pulses to program to State(3). To program the cell from the checkpoint to State(3), additional three pulses to bring the total to five pulses are applied. After the cell has been subject to the number of pulses equal to the program index, the cell is inhibited from programming while other cells in the page may continue to be programmed.

Subsequent Programming Passes with Index Programming to Improve Program Accuracy and to Tighten Threshold Distribution According another general aspect of the invention, a multiple-pass index programming method operating on a group of memory cells in parallel includes an initial programming pass and the building of a program index for each cell. The initial programming pass is followed by a verify step and additional programming passes to trim any short-falls by the initial pass. By using index programming, the multiple-pass programming is performed with much reduced number of verify operations.

The first programming pass, while building the program index for each cell, preferably also programs each cell of the group to within a shortfall close to its respective target state. Then in one or more subsequent programming pass, each of the cells is further programmed from its shortfall to its target state. It is preferably accomplished by a verify step before each subsequent programming pass but not between each pulse in a pass. If a cell is not yet verified, it is enabled for additional programming in the next programming pass. The program index for a cell at the end of a programming pass indicates the last programming voltage level the cell has received. If the verify step reveals the cell as not verified to its target state, the program index will be incremented by a predetermined amount to provide the expected maximum programming voltage allowed in the next programming pass in order to program the cell towards its target state. In the preferred embodiment, the program index is expressed in terms of a pulse number and is incremented by one. In the next programming pass, the memory cell will then be subject to the next pulse based on its updated program index.

During the next programming pass, a verified cell is inhibited from further programming. An unverified cell is enabled to be programmed by one pulse beyond the one in the last programming pass. The verify step and programming pass are repeated until all the cells in the group are verified to their respective target states. In this way, it is possible to program a page of memory cells in parallel accurately to their respective target states by applying the entire run of the pulse train before performing a verify step.

The advantage of index programming is that the group of cells can be programmed without the need for a verify step in between each programming pulse of the programming pass. Index programming will greatly improving the performance of the programming operation.

Figure 21:
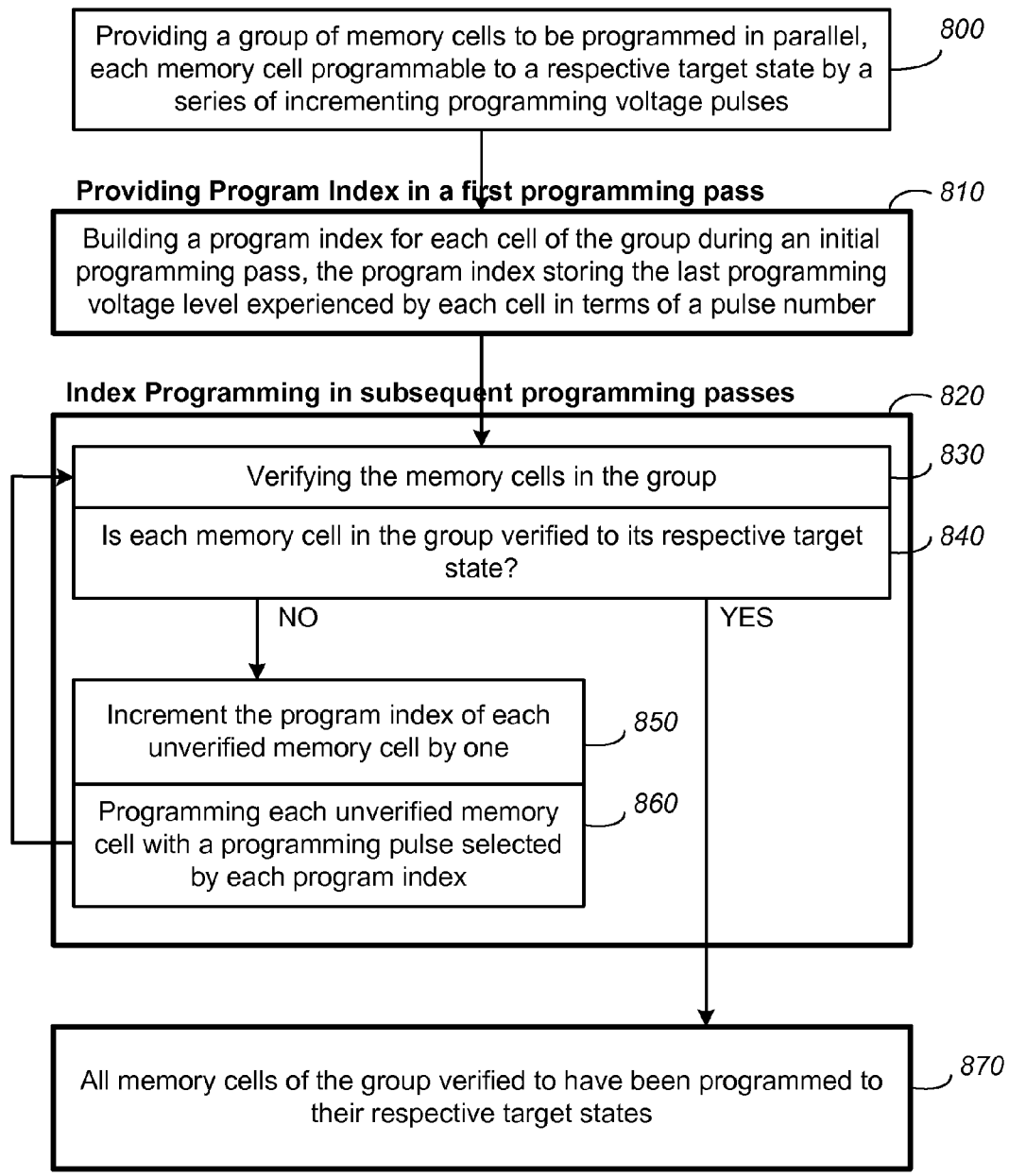
FIG. 21 is a flow diagram illustrating a preferred embodiment of the index programming method.

FIG. 21 is a flow diagram illustrating a preferred embodiment of the index programming method. The method comprises a first programming pass STEP 810 for establishing the program index for each cell followed by additional passes STEP 820 of verifying and index programming to program the cells to their respective target states.

STEP 800: Providing a group of memory cells to be programmed in parallel, each memory cell programmable to a respective target state by a series of incrementing programming voltage pulses.

STEP 810: Building a program index for each cell of the group during an initial programming pass, the program index storing the last programming voltage level experienced by each cell in terms of a pulse number.

STEP 820 is to verify after a programming pass and update the program index for a next programming pass. It further comprises STEP 822, STEP 824, STEP 826 and STEP 828:

STEP 830: Verifying the memory cells in the group.

STEP 840: Is each memory cell in the group verified to its respective target state? If verified, proceeding to STEP 870; otherwise, proceeding to STEP 850.

STEP 850: Increment the program index of each unverified memory cell by one.

STEP 860: Programming each unverified memory cell with a programming pulse selected by each program index. In the preferred embodiment, the programming pulse selected has the same pulse number as that indicated by the program index. Proceeding to STEP 830 for another programming pass.

STEP 870: All memory cells of the group verified to have been programmed to their respective target states.

The index programming method illustrated in FIG. 13 and FIG. 21 are preferably implemented in the state machine 112 (see FIG. 1) in the control circuitry 110 that controls memory operations of the memory array 200.

FIG. 22 illustrates the additional verifying and programming passes shown in STEP 820 of FIG. 21 for trimming the programmed results after the first pass. After a first shot at the target state in the first programming pass, each memory cell is checked by verification. The first programming pass tends to under shoot the target state. If any cell fails to verify to its target state, it is enabled for incremental programming in a second programming pass. This verifying and programming process is repeated until all the cells in the page are verified to their respective target state. In this way, by trimming the programmed result of a previous pass, a cell is able to converge accurately to its target state. Typical, one or two trimming passes are needed.

FIG. 23 illustrates schematically a latch for storing a verify status flag. In a preferred embodiment, a latch 432, which is part of the data latches 430 shown in FIG. 8, is used to store a verify status bit. For example, when a cell is verified, the verify status bit in the latch 432 is set to "0". This flag will cause the control logic to inhibit further program/verify operation on this cell. On the other hand, if the cell fails to verify, the flag will cause the control logic to allow additional programming on the cell in the next programming pass. A conventional implementation of a verify status flag is to indicate a program-inhibit through target change. In that case, when a cell verifies, the target data is programmed into the cell and is no longer needed. Thus, the data value in the data latch indicating the target data is reset from a "Target code" to an "Erase code" to designate the status that the cell is verified. In the present invention, because of the need of the target data in subsequent programming pass, it is retained in the data latch. Instead the verify status is stored in the verify status flag.

FIG. 24A is a flow diagram illustrating a method of enabling unverified memory cells for further programming by the use of the verify status flag. The following STEP 842 and STEP 844 take place while performing STEP 840 in FIG. 21.

STEP 842: Setting a verify status flag in the latch according to the verified outcome.

STEP 844: Responsive to the verify status flag indicating that the memory cell is not verified, proceeding to STEP 850 otherwise proceeding to STEP 870 of FIG. 21.

In a second preferred embodiment, the unverified memory cell is enabled for further trim programming by offsetting higher the program index for the memory cell by a predetermined number. In most cases, the predetermined number in the offset is one. In this way, in the next programming pass, the memory cell will be programmed by an additional predetermined number of pulses.

FIG. 24B is a flow diagram illustrating a method of enabling unverified memory cells for further programming by offsetting the program index for the memory cell. STEP 850 of FIG. 21 is replaced by STEP 850'.

STEP 850': When the memory cell is not verified, incrementing the program index for the memory cell by a predetermined number so that in a subsequent programming pass, the memory cell is enabled to be subject to an additional predetermined number of pulses.

In a third preferred embodiment, the unverified memory cell is enabled for further trim programming by offsetting lower the pulse count by a predetermined number in the next programming pass. In this way, the memory cell will be programmed by an additional predetermined number of pulses.

FIG. 24C is a flow diagram illustrating a method of enabling unverified memory cells for further programming by offsetting the pulse count. STEP 850 of FIG. 21 is replaced by STEP 852.

STEP 852: When the memory cell is not verified, decrementing the programming pulse count by a predetermined number so that in a subsequent programming pass, the memory cell is enabled to be subject to an additional predetermined number of pulses.

FIG. 25 is a table illustrating estimated numbers of programming pulses and verifying cycles to program a page using the index programming technique. For example, for an N-bit memory, the partitioning is into $Ns=2^N$ states. The number of program pulses is at least the same of the number of states Ns. Estimates are given for the number of pulses and verifies for 1.1) program-verified to the checkpoint, 1.2) predictive programming from the checkpoint to the target state, and 2) one or more trimming passes. The last column in FIG. 12 shows the estimate for the total number of verifies. It can be seen that essentially, it is proportional to the number of memory states. This attribute can be compared to that from using the conventional method shown in FIG. 12, where the total number of verifies is proportional to the square of the number of states. For example, for a memory with 3-bit memory cells, the total number of verifies is estimated to be about 18 as compared to the conventional 56. The saving is even more dramatic for 4-bit memory where the total number of verifies is 34 compared to 240.

Correlated Multi-Pass Programming

The index programming method illustrated in FIG. 13 requires multiple programming passes. A first pass for indexing and predictive programming is very likely followed by one or two index programming passes to trim the programmed threshold closer to the target state. The number of pulses in each programming pass is at least equal to the number of memory states. This will give a rough granularity with each pulse increasing the threshold voltage of a cell by an amount equivalent to the separation between two states. As a result, the threshold distribution for each memory state (see for example FIG. 10) will be spread out.

With current algorithms, for obtaining a tighter threshold voltage distribution for each memory state, it is possible to use finer and finer step size with each pass. For example, in the first trimming, the pulse step size can be twice as fine compared to that used in the predictive programming. Similarly, in the second trimming, the pulse step size can be twice as fine compared to that used in the first trimming, and so on. However, each time the step size is reduced by half, the number of pulses and therefore the programming time will double.

According to another aspect of the invention, a group of memory cells are programmed in parallel in multiple programming passes in which the programming voltages in the multiple passes are correlated. Each programming pass employs a programming voltage in the form of a staircase pulse train with a common step size, and each successive pass has the staircase pulse train offset from that of the previous pass by a predetermined offset level. The predetermined offset level is less than the common step size and may be less than or equal to the predetermined offset level of the previous pass.

In one preferred embodiment, the predetermined offset is half of that of the previous pass. For example, the staircase pulse train of the second pass is offset from the first by half a step size and the staircase pulse train of the third pass is offset from the second by a quarter step size. In this way, the same programming resolution can be achieved over multiple passes using few programming pulses than that the conventional method of using multiple passes with each pass using a programming staircase pulse train with finer step size.

Figure 26:
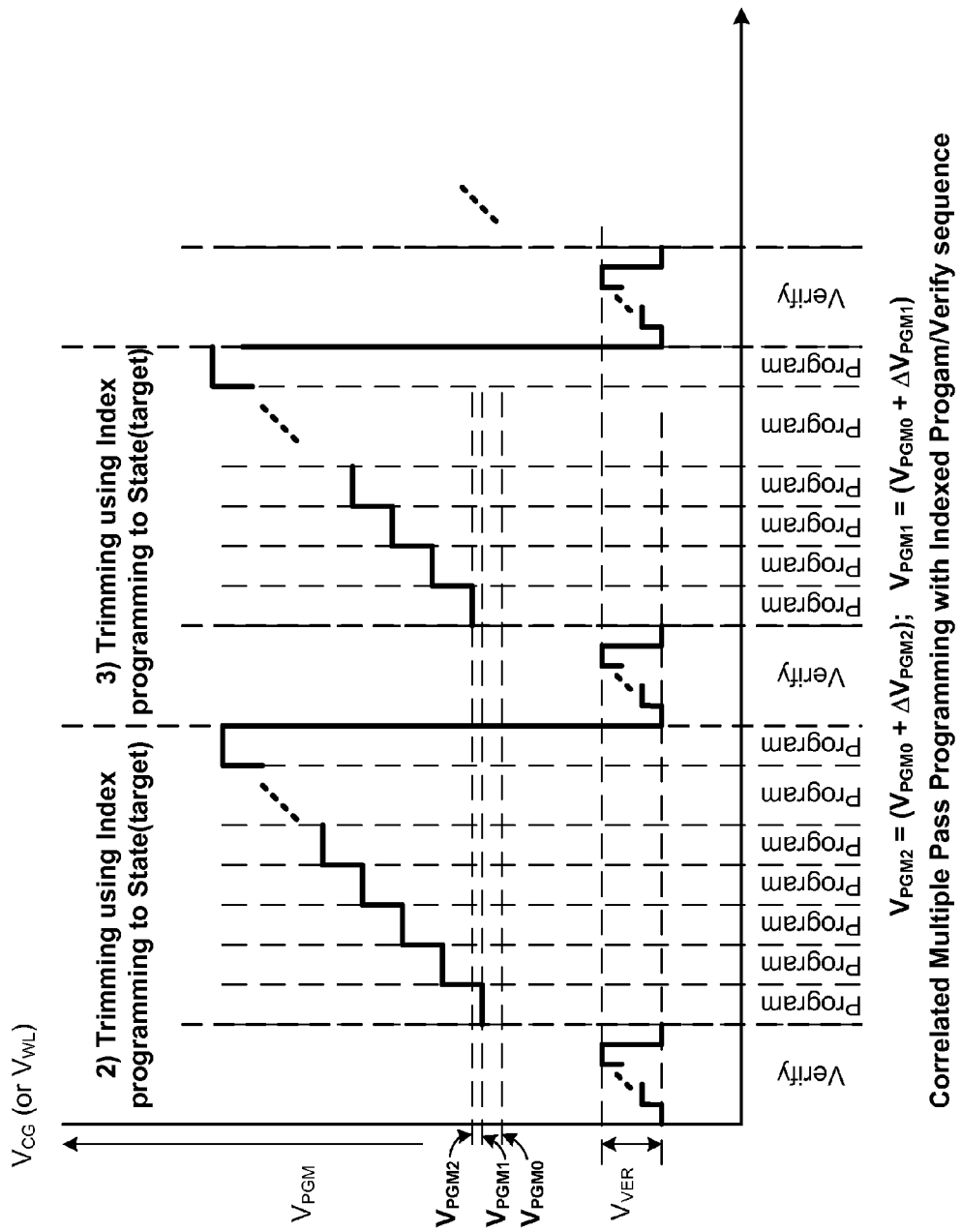
FIG. 26 illustrates the application of the correlated multi-pass programming to the index programming passes shown in FIG. 21.

FIG. 26 illustrates the application of the correlated multi-pass programming to the index programming passes shown in FIG. 21. In that regard, FIG. 26 also shows the trimming programming passes 2) and 3) that follows from the first programming pass such as that shown in FIG. 17 and FIG. 22. The staircase pulse trains used in the three passes all have the same step size. The staircase pulse train used in the first programming pass 1) has an initial programming voltage of $V_{PGM0}$. On the other hand, the staircase pulse train used in the second programming pass 2) has an initial programming voltage of $V_{PGM1}$ where $V_{PGM1}$ is correlated to $V_{PGM0}$ such that $V_{PGM1}=V_{PGM0}+\Delta V_{PGM1}$. In a preferred embodiment, $\Delta V_{PGM1}$=half step size.

Similarly, the staircase pulse train used in the third programming pass 3) has an initial programming voltage of $V_{PGM2}$ where $V_{PGM2}$ is correlated to $V_{PGM1}$ and $V_{PGM0}$ such that $V_{PGM2}=V_{PGM0}+\Delta V_{PGM2}=V_{PGM1}+\Delta V_{PGM12}$. In a preferred embodiment, $\Delta V_{PGM2}=3/4$ step size, or $\Delta V_{PGM12}=1/4$ step size.

Thus, the correlated multi-pass programming employs the same staircase pulse train for programming each pass, except the DC level of the entire staircase pulse is shifted higher by a predetermined amount with each pass. In the preferred embodiment, the second pass is shifted by half a step size and the third pass is shifted by a quarter step size relative to the previous pass. The programming employing these three correlated programming voltage waveforms yields the same resolution as three conventional single-pass programming where each pass uses a staircase waveform half the step size from that of the previous pass.

Figure 27:
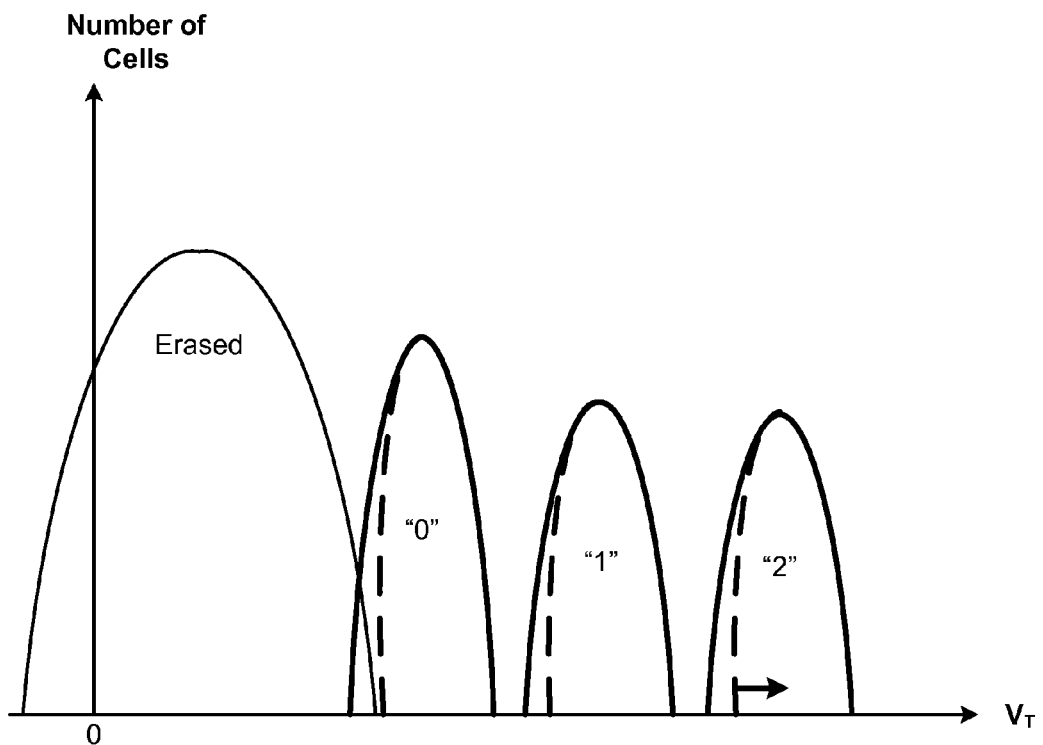
FIG. 27 illustrates the tightening of the threshold voltage distribution of the memory states by using multiple-pass programming.

FIG. 27 illustrates the tightening of the threshold voltage distribution of the memory states by using multiple-pass programming. The lower edge of each distribution is tightened with every pass.

FIG. 28A is a table showing the number of programming pulses used in a conventional multiple-pass programming for various partitioning of memory states. It will be seen that the number of pulses is $(2^0+2^1+ \ldots +2^{P-1}) \times 2^N$, where P is the number of programming pass. For example, for 3-pass programming, a 3-bit cell will require 56 pulses and a 4-bit cell will require 112 pulses.

FIG. 28B is a table showing the number of programming pulses used in the correlated multiple-pass programming for various partitioning of memory states. It will be seen that the number of pulses is just $P \times 2^N$. For example, for 3-pass programming, a 3-bit cell will require 24 pulses and a 4-bit cell will require 48 pulses, which are much less than that required by the conventional multiple-pass programming shown in FIG. 28A.

Figure 29:
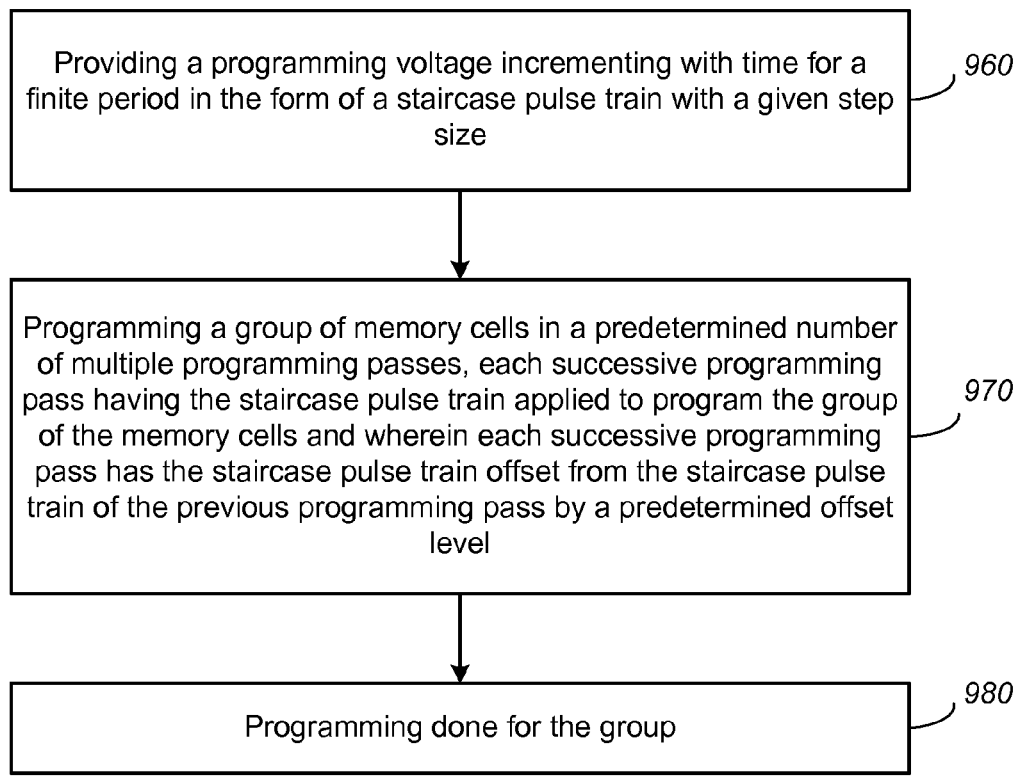
FIG. 29 is a flow diagramming illustrating a multiple-pass programming method employing correlated programming levels between the passes.

FIG. 29 is a flow diagramming illustrating a multiple-pass programming method employing correlated programming levels between the passes.

STEP 960: Providing a programming voltage incrementing with time for a finite period in the form of a staircase pulse train with a given step size.

STEP 970: Programming a group of memory cells in a predetermined number of multiple programming passes, each successive programming pass having the staircase pulse train applied to program the group of the memory cells and wherein each successive programming pass has the staircase pulse train offset from the staircase pulse train of the previous programming pass by a predetermined offset level.

STEP 980: Programming done for the group.

The multiple-pass index programming technique allows substantial saving in the number verify operations. Similarly, the multiple-pass correlated programming technique allows substantial saving in the number programming pulses required. The two techniques can be integrated together into a high performance, multiple-pass index and correlated programming. The benefits are even more so for a memory configured to store three or more bits of data per cell.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A method of programming a group of non-volatile memory cells in parallel, comprising:
    programming the group of memory cells in multiple programming passes,
    the multiple programming passes employing a programming voltage having a staircase pulse train having a given step size applied to program the group of the memory cells, and the staircase pulse trains of successive programming passes are offset from each other by predetermined offset levels.

2. The method as in claim 1, wherein:
the predetermined offset level in each programming pass is less than the given step size and less than or equal to the predetermined offset level of a previous programming pass.

3. The method as in claim 1, wherein:
the multiple programming passes comprises:
a first programming pass using a first staircase pulse train;
a second programming pass using a second staircase pulse train similar to the first staircase pulse train but offset from the first staircase pulse train by one half of the step size.

4. The method as in claim 3, further comprising:
a third programming pass using a third staircase pulse train similar to the second staircase pulse train but offset from the second staircase pulse train by one quarter of the step size.

5. The method as in claim 1, wherein each memory cell of the group of non-volatile memory cells is programmable to a respective target state, and said method further comprises:
(a) providing a program index for each memory cell of the group under programming, the program index of a memory cell indicating the last programming voltage level used to program the memory cell;
(b) applying the programming voltage as a series of incrementing voltage pulses in a programming pass to the group of memory cells; and
(c) allowing programming or inhibiting programming of a memory cell during the programming pass according to the program index of the cell.

6. The method as in claim 5, wherein:
said applying a programming voltage as a series of incrementing voltage pulses is performed without a verify step on the group of memory cells in between the voltage pulses during the programming pass.

7. The method as in claim 5, wherein:
the predetermined offset level in each programming pass is less than the given step size and less than or equal to the predetermined offset level of a previous programming pass.

8. The method as in claim 5, wherein:
the multiple programming passes comprises:
a first programming pass using a first staircase pulse train;
a second programming pass using a second staircase pulse train similar to the first staircase pulse train but offset from the first staircase pulse train by one half of the step size.

9. The method as in claim 8, further comprising:
a third programming pass using a third staircase pulse train similar to the second staircase pulse train but offset from the second staircase pulse train by one quarter of the step size.

10. The method as in claim 1, wherein each memory cell has a charge storing element which is a floating gate of a field effect transistor.

11. The method as in claim 1, wherein each memory cell has a charge storing element which is a dielectric layer in a field effect transistor.

12. The method as in claim 1, wherein the nonvolatile memory has memory cells with a NAND structure.

13. The method as in claim 1, wherein the non-volatile memory is a flash EEPROM.

14. The method as in claim 1, wherein the nonvolatile memory is embodied in a memory card.

15. A method as claim 1, wherein the memory cells under programming each stores more than one bit of data.

16. A nonvolatile memory, comprising:
an array of memory cells, wherein each memory cell is programmable to a respective target state;
read/write circuits for reading and programming a group of memory cells in parallel;
said read/write circuits performing programming that comprises:
programming the group of memory cells in multiple programming passes,
the multiple programming passes employing a programming voltage having a staircase pulse train having a given step size applied to program the group of the memory cells, and
the staircase pulse trains of successive programming passes are offset from each other by predetermined offset levels.

17. The non-volatile memory as in claim 16, wherein:
the predetermined offset level in each programming pass is less than the given step size and less than or equal to the predetermined offset level of a previous programming pass.

18. The non-volatile memory as in claim 16, wherein:
the multiple programming passes comprises:
a first programming pass using a first staircase pulse train;
a second programming pass using a second staircase pulse train similar to the first staircase pulse train but offset from the first staircase pulse train by one half of the step size.

19. The non-volatile memory as in claim 18, further comprising:
a third programming pass using a third staircase pulse train similar to the second staircase pulse train but offset from the second staircase pulse train by one quarter of the step size.

20. The non-volatile memory as in claim 16, further comprises:
a program index for each memory cell of the group under programming, the program index of a memory cell indicating the last programming voltage level used to program the memory cell;
said read/write circuits performing programming that comprises:
applying the programming voltage as a series of incrementing voltage pulses in a programming pass to the group of memory cells; and
allowing programming or inhibiting programming of a memory cell during the programming pass according to the program index of the cell.

21. The non-volatile memory as in claim 20, wherein:
said read/write circuits applying a programming voltage as a series of incrementing voltage pulses is performed without a verify step on the group of memory cells in between the voltage pulses during the programming pass.

22. The non-volatile memory as in claim 20, wherein:
the predetermined offset level in each programming pass is less than the given step size and less than or equal to the predetermined offset level of a previous programming pass.

23. The non-volatile memory as in claim 20, wherein:
the multiple programming passes comprises:
a first programming pass using a first staircase pulse train;
a second programming pass using a second staircase pulse train similar to the first staircase pulse train but offset from the first staircase pulse train by one half of the step size.

24. The non-volatile memory as in claim 23, further comprising:
a third programming pass using a third staircase pulse train similar to the second staircase pulse train but offset from the second staircase pulse train by one quarter of the step size.

25. The non-volatile memory as in claim 16, wherein each memory cell has a charge storing element which is a floating gate of a field effect transistor.

26. The non-volatile memory as in claim 16, wherein each memory cell has a charge storing element which is a dielectric layer in a field effect transistor.

27. The non-volatile memory as in claim 16, wherein the nonvolatile memory has memory cells with a NAND structure.

28. The non-volatile memory as in claim 16, wherein the non-volatile memory is a flash EEPROM.

29. The non-volatile memory as in claim 16, wherein the nonvolatile memory is embodied in a memory card.

30. A non-volatile memory as claim 16, wherein the memory cells under programming each stores more than one bit of data.

* * * * *